US012672329B2

(12) United States Patent
Suto et al.

(10) Patent No.: US 12,672,329 B2
(45) Date of Patent: Jun. 30, 2026

(54) SILICON CARBIDE SEMICONDUCTOR DEVICE

(71) Applicant: Hitachi, Ltd., Tokyo (JP)

(72) Inventors: Takeru Suto, Tokyo (JP); Keisuke Kobayashi, Tokyo (JP); Tomoka Suematsu, Tokyo (JP); Haruka Shimizu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 440 days.

(21) Appl. No.: 18/494,035

(22) Filed: Oct. 25, 2023

(65) Prior Publication Data

US 2024/0162297 A1 May 16, 2024

(30) Foreign Application Priority Data

Nov. 14, 2022 (JP) ................................. 2022-182005

(51) Int. Cl.
*H10D 62/832* (2025.01)
*H10D 30/60* (2025.01)
(Continued)

(52) U.S. Cl.
CPC ....... *H10D 62/8325* (2025.01); *H10D 30/615* (2025.01); *H10D 62/127* (2025.01); *H10D 64/649* (2025.01)

(58) Field of Classification Search
CPC .. H10D 62/107; H10D 84/146; H10D 62/154; H10D 62/157; H10D 30/662;
(Continued)

(56) References Cited

U.S. PATENT DOCUMENTS 8,525,254 B2 9/2013 Treu et al.
2018/0033876 A1* 2/2018 Sugahara ............. H10D 12/481
(Continued)

FOREIGN PATENT DOCUMENTS

CN 108417617 A 8/2018
CN 108962977 A 12/2018
JP 2012-44167 A 3/2012

OTHER PUBLICATIONS

Williams, R. K., et al., "The Trench Power MOSFET—Part II: Application Specific VDMOS, LDMOS, Packaging, and Reliability," in IEEE Transactions on Electron Devices, vol. 64, No. 3, pp. 692-712, (2017).
German Office Action issued on Sep. 15, 2025 for German Patent Application No. 102023129948.4.

*Primary Examiner* — Mouloucoulaye Inoussa
(74) *Attorney, Agent, or Firm* — Volpe Koenig

(57) ABSTRACT

A silicon carbide semiconductor device includes: a trench formed on an upper surface of a silicon carbide semiconductor substrate; a gate electrode in the trench; an n-type drift layer, a p-type guard region, an n-type semiconductor region to which a source potential is applied, a p-type body layer and an n-type current diffusion region that have a lower impurity concentration than that of the guard region, the n-type drift layer, the p-type guard region, the n-type semiconductor region, the p-type body layer, and the n-type current diffusion region being formed in the silicon carbide semiconductor substrate; and an n-type JFET region that is formed in the silicon carbide semiconductor substrate so as to be separated from the trench and that connects the current diffusion region and the drift layer. The semiconductor region is separated from the drift layer, the current diffusion region, and the JFET region.

13 Claims, 13 Drawing Sheets

(51) Int. Cl.
    *H10D 62/10*       (2025.01)
    *H10D 64/64*       (2025.01)

(58) Field of Classification Search
    CPC .. H10D 30/668; H10D 30/615; H10D 64/649;
                H10D 62/127; H10D 62/8325; H10D
            62/393; H10D 64/01366; H10D 62/8503;
            H10D 62/104; H10P 14/24; H10P 14/271;
               H10P 14/2904; H10P 14/2925; H10P
              14/3208; H10P 14/3242; H10P 14/3258;
                H10P 14/3408; H10P 14/3441; H10P
             30/20; H10P 30/2042; H10P 30/21; H10P
                30/22; H10W 10/01; H10W 10/031;
                               H10W 10/30
    See application file for complete search history.

(56)                References Cited

U.S. PATENT DOCUMENTS

| 2018/0337275 A1* | 11/2018 | Shimizu | H10D 30/668 |
| 2019/0035883 A1* | 1/2019 | Takeuchi | H10D 8/60 |
| 2019/0140091 A1* | 5/2019 | Kinoshita | H10D 62/393 |
| 2020/0161480 A1* | 5/2020 | Okamoto | H10D 8/60 |
| 2020/0295129 A1* | 9/2020 | Kinoshita | H10D 30/668 |
| 2020/0403066 A1* | 12/2020 | Narita | H10D 30/0297 |
| 2021/0005746 A1* | 1/2021 | Suto | H10D 62/107 |
| 2021/0384298 A1* | 12/2021 | Hoshi | H10D 30/669 |
| 2022/0077312 A1* | 3/2022 | Hoshi | H10D 30/665 |
| 2022/0285483 A1* | 9/2022 | Tsuji | H10D 30/668 |
| 2022/0320268 A1* | 10/2022 | Moriya | H10D 30/668 |
| 2022/0416018 A1* | 12/2022 | Matsunaga | H10D 62/141 |

* cited by examiner

| | | |
|---|---|---|
| 2 GATE ELECTRODE | 6c SEMICONDUCTOR REGION | 9 TRENCH |
| 4 DRIFT LAYER | 7 CURRENT DIFFUSION REGION | 13 JFET REGION |
| 5 BODY LAYER | 8 GUARD REGION | |

SILICON CARBIDE SEMICONDUCTOR DEVICE

BACKGROUND OF THE INVENTION

1. Field of the Invention

The present invention relates to a silicon carbide semiconductor device which is a power semiconductor device, and particularly relates to a device having a trench structure.

2. Description of the Related Art

Conventionally, in a power metal insulator semiconductor field effect transistor (Metal Insulator Semiconductor Field Effect Transistor: MISFET), which is one example of a power semiconductor device, a power MISFET utilizing a silicon (Si) substrate (hereinafter referred to as an Si power MISFET) has mainly been used.

However, a power MISFET utilizing a silicon carbide (SiC) substrate (hereinafter referred to as an SiC substrate) (referred to hereinbelow as an SiC power MISFET) is capable of achieving a higher withstand voltage and a lower loss than an Si power MISFET. For this reason, SiC power MISFETs have attracted particular attention in the field of power savings or environmentally friendly inverter technologies.

An SiC power MISFET is capable of reducing on-resistance at the same withstand voltage in comparison with an Si power MISFET. This is because silicon carbide (SiC) has a dielectric breakdown field strength as large as about seven times that of silicon (Si), and an epitaxial layer which is to serve as a drift layer can be thinned.

JP 2012-44167 A discloses a MOSFET in which a source region in contact with a lower portion of a trench in which a gate electrode is embedded is formed, and a channel through which a current flows from top to bottom is formed in the vicinity of a lateral surface of the trench.

SUMMARY OF THE INVENTION

In a FIN-type trench gate-type MOSFET in which gate electrodes are embedded in a plurality of trenches formed on an upper surface of a semiconductor substrate, it is conceivable that channels are formed along the lateral surfaces of the trenches, and that current flows in a lateral direction through the channels. In this case, the channel width (gate width) can be increased only in a narrow range, and it is difficult to improve the performance of the silicon carbide semiconductor device. In addition, this kind of MOSFET is confronted with the problem that the electric field tends to concentrate near the upper corner of the trench and that the channel length tends to vary. Furthermore, because it is necessary to form a deep trench, there is also a problem that the electric field tends to rise and the short circuit tolerance is low.

Other problems and novel features will become apparent from the description of the present specification and the accompanying drawings.

An outline of representative embodiments disclosed in the present application will be briefly described as follows.

A silicon carbide semiconductor device according to an embodiment includes: a silicon carbide semiconductor substrate having a first main surface and a second main surface on a side opposite to that of the first main surface; a source electrode formed on the first main surface; a plurality of side-by-side source contact regions that are connecting portions between the first main surface and the source electrode and that extend along the first main surface; a plurality of trenches formed side by side in a direction parallel to a long side of the source contact regions, in the first main surface between the source contact regions, which are adjacent to each other in a short-side direction of the source contact regions; a gate electrode formed in the trenches via an insulating film; a first semiconductor region of a first conductivity type; a second semiconductor region of a second conductivity type different from the first conductivity type; a third semiconductor region of the first conductivity type that is in contact with a first lateral surface of the trench and to which a source potential is applied; a fourth semiconductor region of the second conductivity type that is in contact with the first lateral surface of the trench and that has an impurity concentration lower than that of the second semiconductor region; a fifth semiconductor region of the first conductivity type that is in contact with the first lateral surface of the trench, the first semiconductor region, the second semiconductor region, the third semiconductor region, the fourth semiconductor region, and the fifth semiconductor region being formed in order from the second main surface toward the first main surface in the silicon carbide semiconductor substrate; and a sixth semiconductor region of the first conductivity type that is formed in the silicon carbide semiconductor substrate so as to be separated from the trench and that connects the fifth semiconductor region and the first semiconductor region, in which the third semiconductor region is separated from the first semiconductor region, the fifth semiconductor region, and the sixth semiconductor region, in which the gate electrode, and the third semiconductor region, the fourth semiconductor region, and the fifth semiconductor region, which are regions adjacent to the first lateral surface of the trench and overlapping each other in plan view, constitute a field effect transistor, and in which a channel of the field effect transistor is generated between the third semiconductor region and the fifth semiconductor region in the fourth semiconductor region in contact with the first lateral surface of the trench.

An advantageous effect afforded by a representative invention among the inventions disclosed in the present application will be briefly described as follows.

According to the present invention, the performance of a silicon carbide semiconductor device can be improved.

BRIEF DESCRIPTION OF THE DRAWINGS

FIG. 5 is a plan view illustrating the silicon carbide semiconductor device split along line C-C in FIG. 2;

FIG. 15 is a plan view and a cross-sectional view illustrating a plurality of unit cells of the silicon carbide semiconductor device which is a Modification 3 according to the embodiment;

DESCRIPTION OF THE INVENTION

Figure 1:
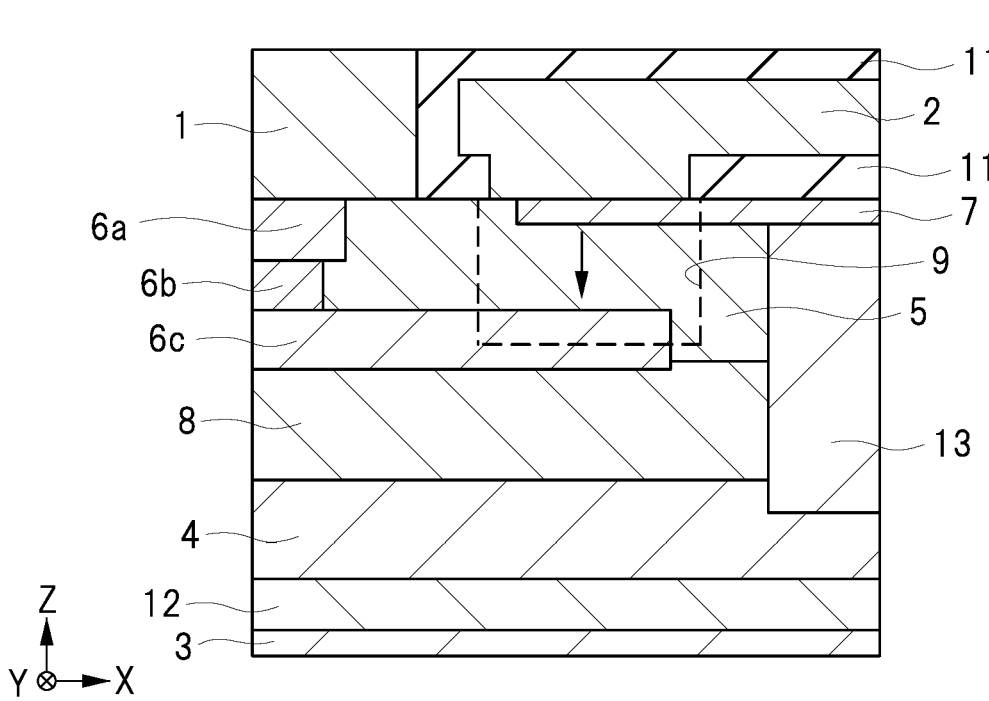
FIG. 1 is a cross-sectional view illustrating a silicon carbide semiconductor device according to an embodiment.

Hereinafter, embodiments according to the present invention will be described in detail with reference to the drawings. Note that, in all the drawings to illustrate the embodiments, members having the same functions are assigned the same reference signs, and repetitive descriptions thereof will be omitted. In the following embodiments, the description of the same or similar parts will not be repeated in principle unless otherwise necessary. In addition, in the drawings illustrating the embodiments, hatching may be applied even in a plan view or a perspective view, or the like, to facilitate understanding of the configuration. Furthermore, in the drawings illustrating the embodiments, hatching may be omitted in a cross-sectional view to facilitate understanding of the configuration.

In addition, and "+" are signs indicating relative impurity concentrations of a conductivity type of an n-type or a p-type, and for example, the concentration of an n-type impurity increases in the order of "$n^{--}$", "$n^{-}$", "n", "$n^{+}$", and "$n^{++}$".

Embodiment

Hereinafter, a silicon carbide semiconductor device will be described with reference to the drawings by taking the example of an SiC power MISFET (Metal Insulator Semiconductor Field Effect Transistor) having a semiconductor layer in contact with a lateral surface of a trench (groove, recess) as a channel region, that is, a trench MOSFET (Metal Oxide Semiconductor Field Effect Transistor).

<Structure of Silicon Carbide Semiconductor Device>

Figure 2:
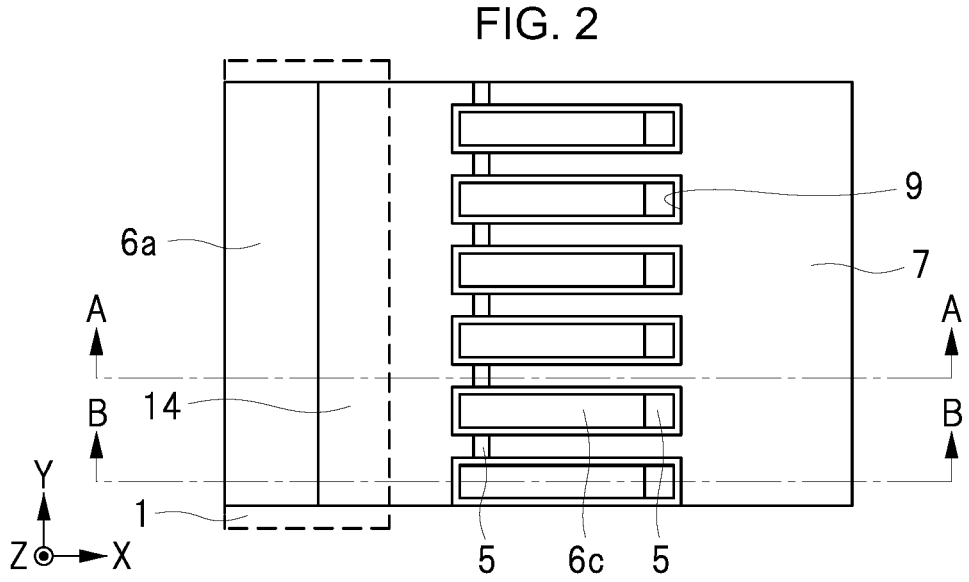
FIG. 2 is a plan view illustrating a silicon carbide semiconductor device according to the embodiment.

A structure of a silicon carbide semiconductor device according to the present embodiment will be described with reference to FIGS. 1 to 6. FIG. 1 illustrates the silicon carbide semiconductor device of the present embodiment in a simple cross-sectional view, and FIGS. 2 to 6 illustrate a more specific configuration of the silicon carbide semiconductor device. In FIG. 2, with regard to structures on the semiconductor substrate, only the contact plug connected to the source potential is indicated by a broken line, and an insulating film (interlayer insulating film) and a gate electrode, which are other structures on the semiconductor substrate, are omitted from the illustration. Further, in each cross-sectional view, an outline of the plurality of trenches, which are not included in the cross-section but are present in the depth direction (Y direction) of the drawing is indicated by a broken line. In addition, in FIG. 2, the in-trench gate electrode and the insulating film covering the bottom surface of the trench are not illustrated, and the structure in the semiconductor substrate under the gate electrode and the insulating film is illustrated in a transparent manner. The same applies to the other plan views.

As illustrated in FIG. 2, the silicon carbide semiconductor device according to the present embodiment includes an n-type silicon carbide (SiC) epitaxial substrate (a silicon carbide semiconductor substrate; hereinafter referred to as the semiconductor substrate) which includes an upper surface (first main surface) and a lower surface (back surface, second main surface) on the side opposite to that of the upper surface. The semiconductor substrate is a laminated substrate that includes an $n^{+}$-type silicon carbide substrate containing silicon carbide and an $n^{-}$-type epitaxial layer (semiconductor layer) formed on the silicon carbide substrate by using an epitaxial growth method. The epitaxial layer is a semiconductor layer containing SiC. In each drawing of the present application, a drift layer 4, which is an $n^{-}$-type semiconductor region mainly constituting an epitaxial layer, is illustrated, and a drain region 12 constituted by a silicon carbide substrate of an $n^{+}$-type semiconductor region is illustrated below the drift layer 4. That is, a portion indicated as the drain region 12 in each drawing is a silicon carbide substrate.

That is, the drain region 12 is formed at a predetermined depth in the semiconductor substrate from the lower surface thereof, and the drift layer 4 is formed in the semiconductor substrate on the drain region 12 (upper surface side) thereof so as to be in contact with the drain region 12. The n-type impurity concentration of the drain region 12 is higher than the n-type impurity concentration of the drift layer 4. The drift layer 4, a body layer 5, a source region 6a, semiconductor regions 6b and 6c, a current diffusion region 7, a guard region 8, and a JFET region 13 are formed in the epitaxial layer.

A drain electrode 3 is formed in contact with the lower surface of the drain region 12, that is, the lower surface of the semiconductor substrate. That is, the lower surface of the semiconductor substrate is covered with the drain electrode 3, and the drain electrode 3 is electrically connected to the drain region 12. The drain electrode 3 is made of a laminated conductor film containing gold (Au), for example.

A trench 9 reaching an intermediate depth of the semiconductor substrate is formed on the upper surface of the semiconductor substrate. A plurality of trenches 9 extend in an X direction along the upper surface of the semiconductor substrate and are arranged side by side in a Y direction orthogonal to the X direction in plan view, for example. A Z direction is the thickness direction of the semiconductor substrate, and is a direction (longitudinal direction and depth direction) orthogonal to each of the X direction and the Y direction. The planar shape of the trench 9, the cross-sectional shape on the X-Z plane, and the cross-sectional shape on the Y-Z plane are, for example, rectangular. That is, the trench 9 has two lateral surfaces extending along the X direction. Here, one of the two lateral surfaces extending along the X direction of the trench 9 is referred to as a first lateral surface.

Figure 4:
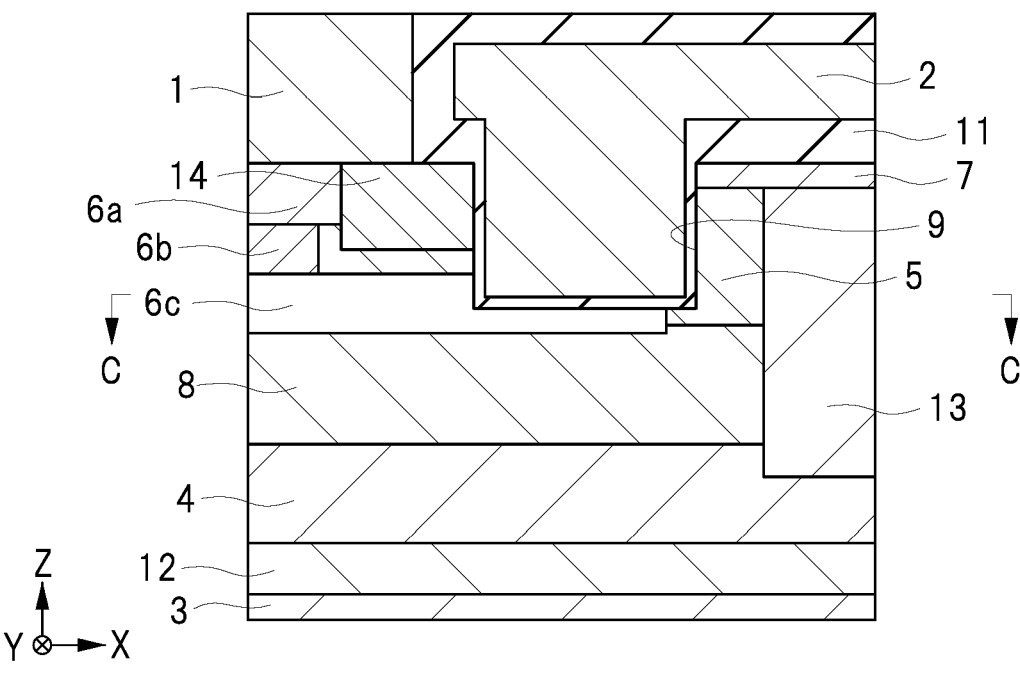
FIG. 4 is a cross-sectional view taken along line B-B in FIG. 2.

A gate electrode 2 is embedded in each trench 9 via an insulating film 11 (see FIG. 4). The gate electrodes 2 in the respective trenches 9 are connected to each other by the gate electrodes 2 extending in the Y direction on the upper surface of the semiconductor substrate. That is, in the cross-section along the Y direction, the gate electrode 2 has a comb-like structure. That is, a plurality of trench gate electrodes arranged side by side in the Y direction are connected in parallel to each other by the gate electrodes 2 above the trench gate electrodes. The lower surface, the lateral surfaces, and the upper surface of the gate electrode 2 extending in the Y direction on the semiconductor substrate are covered with an insulating film 11. That is, the insulating film 11 includes a gate insulating film formed under the gate electrode 2 extending in the Y direction, and an interlayer insulating film formed above the gate insulating film. In plan view, the semiconductor region 6c, the body layer 5, and the current diffusion region 7, which are in contact with the first lateral surface of the trench 9, overlap each other.

In the semiconductor substrate, formed in order from the lower surface side to the upper surface side thereof are: the drain region 12, the drift layer 4, the guard region 8, the semiconductor region 6c in contact with the first lateral surface of the trench 9, the body layer 5 in contact with the first lateral surface of the trench 9, and the current diffusion region 7 in contact with each of the upper surface of the semiconductor substrate and the first lateral surface of the trench 9. Further, in the semiconductor substrate, a junction field effect transistor (JFET) region 13 is formed which is separated from the trench 9 and is in contact with the respective lateral surfaces of the body layer 5 and the guard region 8, a bottom surface of the current diffusion region 7, and an upper surface of the drift layer 4. The JFET region is an n-type semiconductor region sandwiched between p-type semiconductor layers, and has an n-type impurity concentration lower than that of any of the drain region 12, the current diffusion region 7, the source region 6a, and the semiconductor region 6c. The n-type impurity concentration of the JFET region may be higher than the n-type impurity concentration of the drift layer 4, or may be the same as the n-type impurity concentration of the drift layer 4. The semiconductor region 6c is an n$^+$-type semiconductor region, the guard region 8 is a p$^+$-type semiconductor region, the body layer 5 is a p-type semiconductor region, the current diffusion region 7 is an n$^+$-type semiconductor region, and the JFET region 13 is an n-type semiconductor region.

Furthermore, a semiconductor region 6b and a source region 6a are formed in that order toward the upper surface of the semiconductor substrate, directly above the semiconductor region 6c. The source region 6a, which is an n$^{++}$-type semiconductor region, is in contact with the upper surface of the semiconductor substrate and is formed extending a predetermined depth from the upper surface. The n-type impurity concentration of the semiconductor region 6b, which is an n$^-$-type semiconductor region, is lower than the n-type impurity concentration of the JFET region 13. Both the source region 6a and the semiconductor region 6b are in contact with a lateral surface of the body layer 5 and are separated from the trench 9. The above-described insulating film 11 is formed on the upper surface of the semiconductor substrate, and a through-hole (contact hole, connecting hole) is formed in the insulating film 11 directly above the source region 6a. A contact plug (conductive connecting portion, source contact region) 1, which is electrically connected to the source electrode, is embedded in the through-hole. The contact plug 1 is integrated with, for example, a source electrode (not illustrated) formed on the upper surface of the semiconductor substrate and on the insulating film 11. The lower surface of the source region 6a is in contact with the upper surface of the semiconductor region 6b, and the lower surface of the semiconductor region 6b is in contact with the upper surface of the semiconductor region 6c. The source region 6a, the semiconductor region 6b, and the semiconductor region 6c are all separated from the current diffusion region 7, the JFET region 13, the drift layer 4, and the drain region 12. A source potential is applied to the semiconductor region 6c from the source electrode via the contact plug 1, the source region 6a, and the semiconductor region 6b. That is, the contact plug 1 is a connecting portion (source contact region) between the upper surface of the semiconductor substrate, and the source electrode.

The current diffusion region 7 is a low-resistance region for diffusing electrons throughout the entire width of the JFET region 13 in the X direction and allowing current to flow in a wide region when electrons flow from inside the current diffusion region 7 to the JFET region 13. That is, by forming the current diffusion region 7, which has a higher n-type impurity concentration than the JFET region, it is possible to prevent current from flowing locally.

The bottom portion of the trench 9 terminates at an intermediate depth of the semiconductor region 6c. Here, the trench 9 does not reach the guard region 8. In other words, the bottom surface of the trench 9 and the upper surface of the guard region 8 are separated from each other. One end of the bottom portion of the trench 9 in the first direction (x), that is, a lower corner thereof is covered with the semiconductor region 6c. The other end (lower corner) of the bottom portion of the trench 9 in the first direction (x) is separated from the semiconductor region 6c and covered with part of the body layer 5 adjacent to the semiconductor region 6c in the first direction (x). Thus, here, part of the body layer 5 is adjacent to the semiconductor region 6c, but part of the guard region 8 may be adjacent to the semiconductor region 6c. In this case, an end portion (lower corner portion) of the bottom portion of the trench 9 on the JFET region 13 side in the first direction (x) is covered with the guard region 8. Further, the bottom surface of the trench 9 may reach an intermediate depth of the guard region 8 below the semiconductor region 6c. In this case, the entire bottom portion of the trench 9 is covered with the guard region 8. The guard region 8 has a p-type impurity concentration higher than that of the body layer 5. The body layer 5 and the guard region 8 are in contact with each other.

One end of the upper end of the trench 9 in the first direction (x) is covered with the current diffusion region 7, and the other end is separated from the current diffusion region 7 and covered with the body layer 5. One end of the first lateral surface of the trench 9 in the first direction (x) is separated from the current diffusion region 7, and the other end is separated from the semiconductor region 6c.

The source region 6a, the semiconductor region 6b, and the semiconductor region 6c which constitute the source, the drain region 12, the drift layer 4, the JFET region 13, and the current diffusion region 7 which constitute the drain, and the gate electrode 2 constitute a trench MOSFET (MOS field effect transistor having a trench gate). When the MOSFET according to the present embodiment is in the ON state, the channel is formed in a longitudinal direction between the current diffusion region 7 and the semiconductor region 6c directly below the current diffusion region 7, in the body layer 5 adjacent to a lateral surface of the trench 9. Therefore, current flows through the channel (anti-transfer) in the body layer 5 from the current diffusion region 7 toward the semiconductor region 6c, as indicated by the arrow in FIG. 1.

Next, a specific structure of the silicon carbide semiconductor device according to the present embodiment will be described with reference to FIGS. 2 to 6. The silicon carbide semiconductor device is different from the MOSFET illustrated in FIG. 1 only in that a potential fixing region (body contact region) 14 for body contact is formed. The potential fixing region 14 is a p$^{++}$-type semiconductor region that supplies a source potential to the body layer 5 and the guard region 8 and fulfills the role of fixing the potentials of the body layer 5 and the guard region 8.

Figure 3:
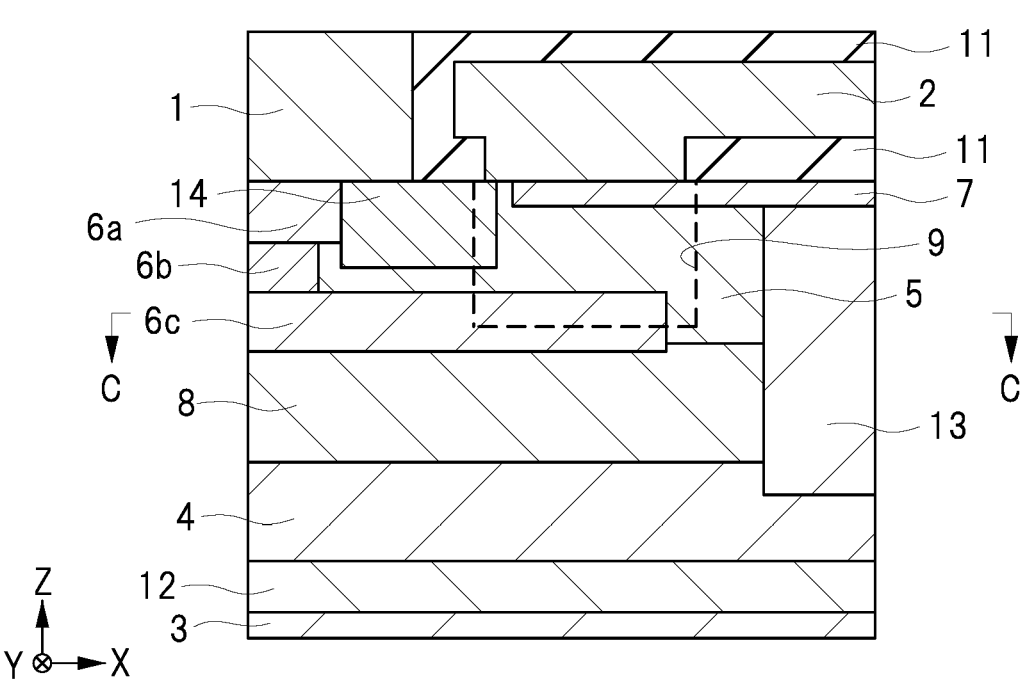
FIG. 3 is a cross-sectional view taken along line A-A in FIG. 2.

As illustrated in FIGS. 2 and 3, the potential fixing region 14 is in contact with the source region 6a in the X direction, and is separated from the current diffusion region 7 via the body layer 5. The potential fixing region 14 is also in contact with the body layer 5, and the first lateral surface of the trench 9. The source region 6a, the potential fixing region 14, the semiconductor regions 6b and 6c, the body layer 5, the current diffusion region 7, the JFET region 13, and the guard region 8 extend in the Y direction. In addition, a plurality of trenches 9 are arranged side by side in the Y direction, which is the short-side direction. A plate-like semiconductor substrate (semiconductor layer) is formed between the trenches 9 adjacent in the Y direction, and this semiconductor layer (protrusion) extending in the X direction and having a relatively thin thickness in the Y direction is called a fin. Therefore, the MOSFET according to the present embodiment is also referred to as a fin-trench MOSFET.

Here, a region where the trenches 9 are arranged side by side in the Y direction is referred to as a trench arrangement region. The source region 6a and the semiconductor region 6b are located on the opposite side of the JFET region 13 across the trench arrangement region in the X direction. In addition, the end of the current diffusion region 7 in the X direction and the end of the semiconductor region 6c in the X direction overlap the trench arrangement region in plan view, the other portion of the current diffusion region 7 extends from the trench arrangement region to one side in the X direction, and the other portion of the semiconductor region 6c extends from the trench arrangement region to the other side in the X direction. In other words, in plan view, the current diffusion region 7 and the semiconductor region 6c extend in opposite directions with the trench arrangement region interposed therebetween.

As indicated by the broken line in FIG. 2, the contact plug 1 extends in the Y direction. The contact plug 1 overlaps, in plan view, both the source region 6a and the potential fixing region 14, which are adjacent to each other in the X direction. The bottom surface of the contact plug 1 is connected to both the source region 6a and the potential fixing region 14. A plurality of trenches 9 are formed side by side in a direction (Y direction) parallel to the long side of the contact plug 1.

The potential fixing region 14 is formed between the semiconductor region 6c and the first main surface of the semiconductor substrate. One end of the upper end of the trench 9 in the X direction is covered with the current diffusion region 7, and the other end is separated from the current diffusion region 7 and covered with the potential fixing region 14. The impurities constituting the potential fixing region 14 are readily diffused downward. Therefore, in order to prevent the semiconductor region 6c from being divided by the potential fixing region 14, a shallow potential fixing region 14 is formed. That is, the potential fixing region 14 is separated from the upper surface of the semiconductor region 6c.

As illustrated in FIG. 4, the gate electrode 2 is embedded in each trench 9 via an insulating film 11. The bottom of the gate electrode 2 is located below the upper surface of the semiconductor region 6c, and the gate electrode 2 is adjacent to the semiconductor region 6c, the body layer 5, and the current diffusion region 7 via the insulating film 11 in the Y direction.

Figure 5:
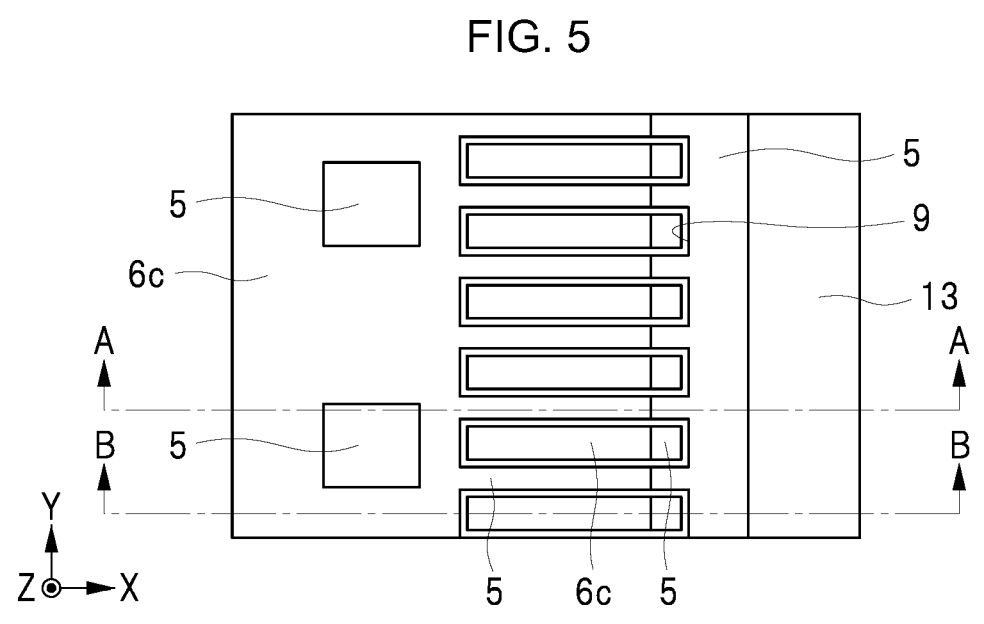

FIG. 5 illustrates a plan view of the semiconductor substrate split along line C-C in FIGS. 3 and 4. However, hatching is not illustrated in FIG. 5. As illustrated in FIG. 5, island-shaped openings are discretely provided side by side in the Y direction in the semiconductor region 6c, and the body layer 5 is formed in the openings. The body layer 5 is connected to the guard region 8 at the bottom portion thereof. Therefore, a source potential is applied from the potential fixing region 14 to the guard region 8 via the body layer 5.

Figure 6:
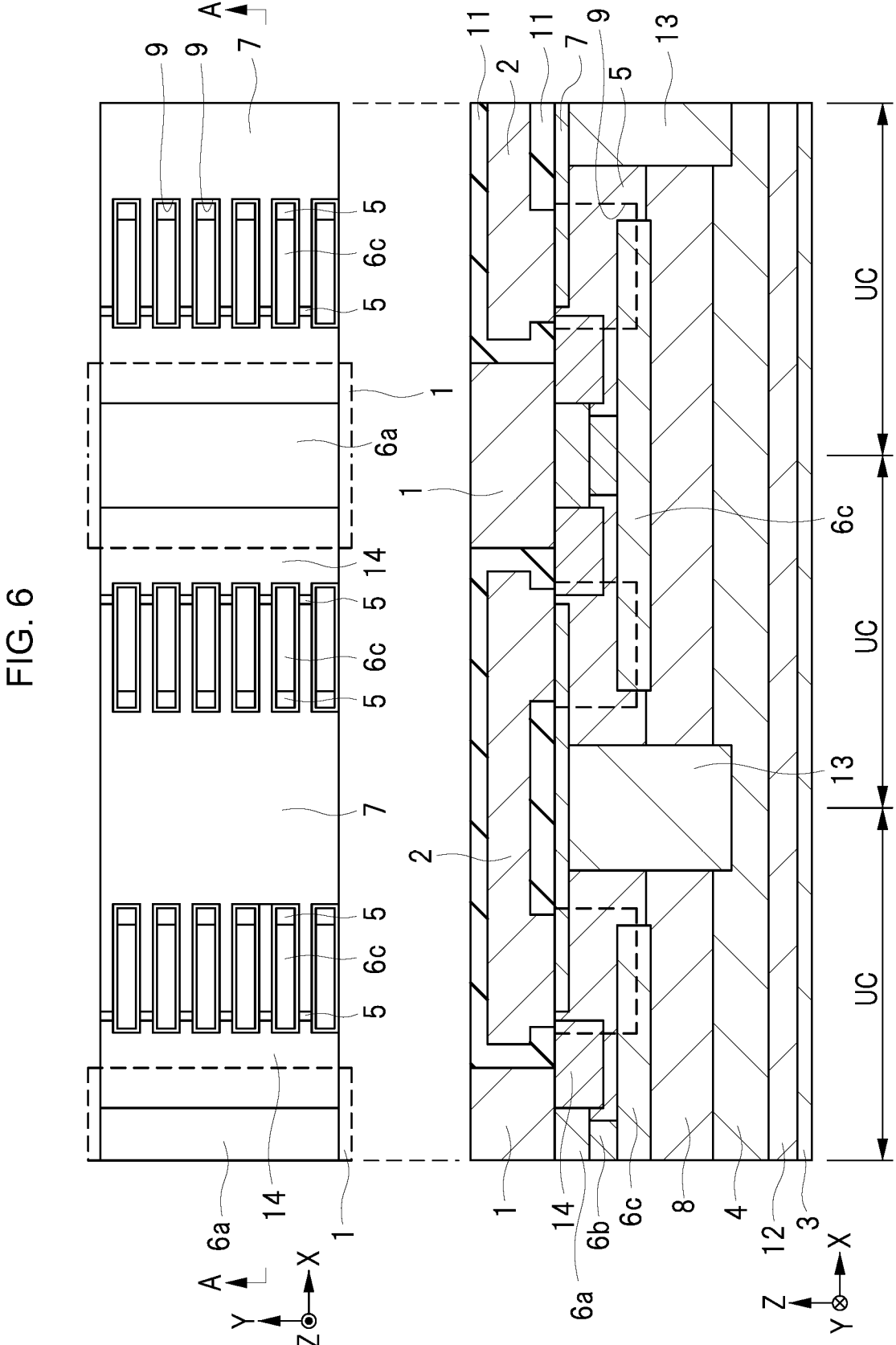
FIG. 6 is a plan view and a cross-sectional view illustrating a plurality of unit cells of the silicon carbide semiconductor device according to the embodiment.

FIGS. 2 to 5 illustrate one unit cell that includes the drift layer 4, the guard region 8, the source region 6a, the semiconductor regions 6b and 6c, the current diffusion region 7, the JFET region 13, and the potential fixing region 14. Note that the unit cell in plan view may extend in the Y direction beyond the ranges illustrated in FIGS. 2 and 5. FIG. 6 illustrates a structure in which a plurality of unit cells are arranged side by side in the X direction, and the cell arrangement will be described. In FIG. 6, a plan view is illustrated on the upper side, and a cross-sectional view of an area corresponding to line A-A of the plan view is illustrated on the lower side.

As illustrated in FIG. 6, unit cells UC of the MOSFET are arranged side by side in the X direction while reversing the layout. That is, a plurality of unit cells UC are arranged side by side in the X direction, and unit cells adjacent to each other in the X direction have a plane layout that is line-symmetric with respect to a boundary line between the unit cells. In other words, the structures of the unit cells adjacent to each other in the X direction are line-symmetric in plan view. In this case, the unit cells, which are adjacent to each other in the Y direction with the JFET region 13 in the center, share one JFET region 13. In other words, in the cross-section illustrated in FIG. 6, it can be said that one unit cell has 0.5 JFET region 13 for one trench arrangement region. A plurality of contact plugs 1 extend in the Y direction along the upper surface of the semiconductor substrate, and are arranged side by side in the short-side direction (X direction). In addition, a plurality of trenches are discretely formed side by side in a direction parallel to the long side of the contact plug 1 on the upper surface of the semiconductor substrate between the contact plugs 1, which are adjacent to each other in the short-side direction.

Here, the JFET region 13 is a region sandwiched between the p-type body layer 5 and the guard region 8. When the MOSFET is in an OFF state, the JFET region 13 is a region in which a depletion layer extends from each of the opposing lateral surfaces of the adjacent p-type semiconductor regions and these depletion layers are in contact with each other.

When the MOSFET is in the OFF state, no channel is formed, and thus no current flows. However, in order to suppress a microcurrent between the source and the drain during the OFF state and improve the withstand voltage, the guard region 8 is provided below the trench 9, and the JFET region 13 is provided beside the guard region 8. That is, by providing the guard region 8, the depletion layer is closed in the JFET region 13 between the adjacent guard regions 8 when the MOSFET is turned off, and hence the current path between the source and the drain is cut off. That is, the guard region 8 fulfills the role of connecting a depletion layer generated around the guard region 8 between the adjacent guard regions 8, thus fulfilling the role of suppressing a microcurrent and improving the withstand voltage. Therefore, even if the impurity concentration of the drift layer 4 is increased for the purpose of reducing element resistance, the withstand voltage during the OFF state can be secured.

Advantageous Effects of Present Embodiment

Figure 21:
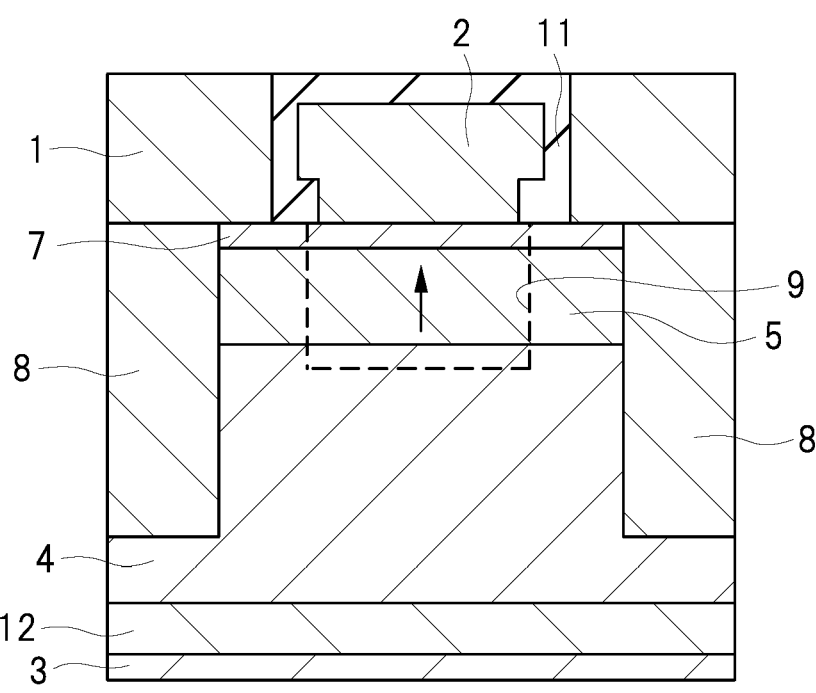
FIG. 21 is a cross-sectional view illustrating a silicon carbide semiconductor device which is a Comparative Example 1.

FIG. 21 is a cross-sectional view of a trench gate MOSFET, which is a silicon carbide semiconductor device of Comparative Example 1. As shown in FIG. 21, the MOSFET of Comparative Example 1 has a drain region 12, a drift layer 4, a body layer 5, and a current diffusion region 7 formed in that order from the lower surface side toward the upper surface side of the semiconductor substrate. The first lateral surface of the trench 9 is adjacent to the drift layer 4, the body layer 5, and the current diffusion region 7, and the drift layer 4, the body layer 5, and the current diffusion region 7 are sandwiched by guard regions 8 separated from the trench 9. The gate electrode 2 is embedded in the trench 9, and a source potential is applied from the contact plug 1 to the guard region 8 and the current diffusion region 7.

In this Comparative Example 1, a channel is formed in the body layer 5 adjacent to the first lateral surface of the trench 9, and a current flows from bottom to top in the channel. In this case, the drift layer 4 sandwiched between the p-type semiconductor regions is considered to function as a JFET region in which the depletion layer is closed during the OFF state. However, in the region below the bottom portion of the trench 9, the length (thickness) of the JFET region is insufficient, and thus it will likely not be possible to adequately yield the advantageous effects of suppressing the microcurrent and improving the withstand voltage.

In Comparative Example 1, only the drift layer 4, which is an n-type semiconductor region, is present between the trench 9 and the drain region 12. Therefore, the trench 9 is close to the drain potential, and the electric field is concentrated and dielectric breakdown is likely to occur. However, even if the trench 9 is made shallow to separate the trench 9 from the drain region 12, it is difficult to make the trench 9 shallow because a desired channel length cannot be obtained when the trench 9 is shallow.

In addition, in Comparative Example 1, a channel (parasitic channel) is readily formed also on a second lateral surface orthogonal to the first lateral surface among the four lateral surfaces of the trench 9. The channel formed in the second lateral surface has characteristics different from those of the channel formed in the first lateral surface due to the plane orientation of the semiconductor substrate, and the like. Therefore, when current flows through both of these channels, the presence of channels having different characteristics causes variations in the characteristics (for example, the threshold voltage) of the MOSFET.

Figure 22:
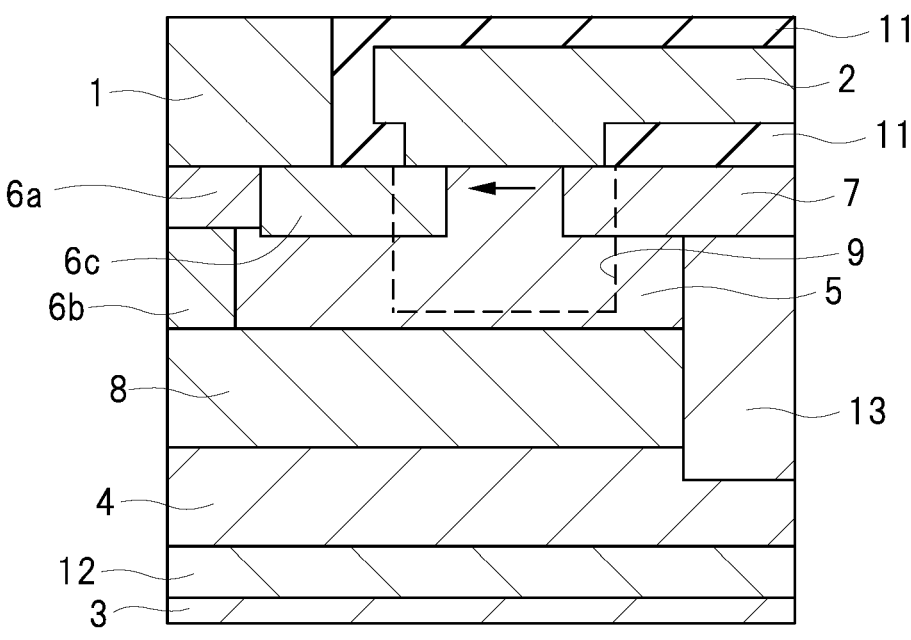
FIG. 22 is a cross-sectional view illustrating a silicon carbide semiconductor device which is a Comparative Example 2.

In contrast, as per Comparative Example 2 illustrated in FIG. 22, the JFET region 13 may conceivably be disposed beside the trench to sufficiently secure the length thereof, thus affording the advantageous effects of suppressing the microcurrent and improving the withstand voltage. The structure of the silicon carbide semiconductor device of Comparative Example 2 is different from that of the present embodiment in that the semiconductor region 6c is formed not on the bottom portion side but on the upper end side of the trench 9 and is directly connected to the source region 6a. In this case, when the MOSFET is in the ON state, the channel is formed along the first lateral surface of the trench 9 in the body layer 5 between the current diffusion region 7 and the semiconductor region 6c, and the current flows in the lateral direction from the current diffusion region 7 side to the semiconductor region 6c side.

Here, because the guard region 8 is interposed between the trench 9 and the drain region 12, an electric field concentration at the bottom portion of the trench 9 due to the drain potential can be relaxed, and dielectric breakdown can be prevented.

However, as a method of widening the channel width in Comparative Example 2, a method of miniaturizing the fin and a method of widening the channel width by making each of the trench 9, the current diffusion region 7, and the semiconductor region 6c deeper are conceivable, but both methods are difficult. Therefore, in the MOSFET of Comparative Example 2, the channel width can be expanded only in a narrow range, and it is difficult to improve the performance of the silicon carbide semiconductor device.

In Comparative Example 2, a channel (parasitic channel) is also formed near the corner of the upper end of the first lateral surface of the trench. Because this channel has the characteristic that the electric field tends to concentrate therein and the threshold voltage is low, the current flowing through this channel is responsible for impairing the trade-off between the resistance of the MOSFET and the threshold voltage.

The MOSFET channel length of Comparative Example 2 is determined by the interval between the current diffusion region 7 and the semiconductor region 6c. The current diffusion region 7 and the semiconductor region 6c formed using photolithography technique and the ion implantation method are likely to have variations in the interval therebetween due to dimensional expansion of the resist mask, misalignment in the photolithography, or the like. The variation in the interval is about ±200 nm at the maximum. Therefore, there is a problem that the characteristics of the MOSFET easily vary in the wafer plane.

In addition, for example, in a case where an abnormal large current is passed due to a short-circuit failure or the like, if the source region 6a and the semiconductor region 6c having high impurity concentrations are in contact with each other as per Comparative Example 2, there is a possibility that a short circuit tolerance cannot be secured because a low concentration region for reducing the voltage is not incorporated.

In contrast, in the present embodiment, the semiconductor region 6c is formed so as to be in contact with the first lateral surface of the trench 9 directly below the current diffusion region 7. Accordingly, when the MOSFET is ON, the channel is generated in the longitudinal direction in the body layer 5 between the semiconductor region 6c and the current diffusion region 7, and the current flows downward from the current diffusion region 7 to the semiconductor region 6c. Therefore, the channel width of the MOSFET can be adjusted by the length of the trench 9 in the first direction (x). Thus, the channel width can be adjusted in a wide range without changing the difficulty of the manufacturing process.

In addition, here, because a channel is generated between the semiconductor region 6c and the current diffusion region 7, which are in contact with the first lateral surface of the trench 9, there is no channel passing through the upper end of each lateral surface of the trench 9. Therefore, it is possible to prevent a current from flowing through a channel having a low voltage characteristic. Accordingly, impairment of the trade-off between the resistance and the threshold voltage of the MOSFET can be prevented, and the threshold voltage can be kept constant.

In addition, the channel length is determined by the interval between the current diffusion region 7 and the semiconductor region 6c. Here, the variation in the depth of the semiconductor region due to ion implantation is more controllable than the variation in the lateral direction of the semiconductor region due to misalignment in photolithography or the like. Therefore, it is possible to suppress the occurrence of variations in the channel length in the wafer plane.

In addition, in comparison with Comparative Example 1, in the present embodiment, the trench 9 only needs to have a depth sufficient to bring the lateral surface into contact with the semiconductor region 6c, and the trench can be shallower. As described above, because the variation in the interval between the current diffusion region 7 and the semiconductor region 6c formed using the photolithography technique and the ion implantation method is small, it is easy to set a shallow depth for the trench 9. Therefore, the trench 9 can be formed shallow while high performance is maintained. Thus, the trench 9 moves away from the drain potential of the drain region 12, and the electric field is reduced. In addition, the electric field is relaxed also because the guard region 8 is formed between the trench 9 and the drain region 12.

In addition, here, as a supply path for the source potential between the source region 6a, which has a high impurity concentration, and the semiconductor region 6c, the n-type semiconductor region 6b having an impurity concentration lower than that of the source region 6a and the semiconductor region 6c is interposed therebetween. By inserting the low-concentration semiconductor region 6b in this manner, the voltage of the semiconductor region 6c can be lowered when an abnormally large current is supplied. Therefore, the gate saturation current decreases, and the short circuit tolerance is improved.

In addition, here, the JFET region 13 is disposed beside the trench 9 to sufficiently secure the length of the JFET region 13, thus affording the advantageous effects of suppressing the microcurrent and improving the withstand voltage.

In addition, here, the current diffusion region 7 does not reach one end of the first lateral surface of the trench 9 in the X direction. Therefore, it is possible to prevent a channel from being formed in the lateral surface on the source region 6a side of the second lateral surface orthogonal to the first lateral surface. In this way, because it is possible to prevent a channel having different characteristics from the channel along the first lateral surface from being generated along the second lateral surface, variations in the MOSFET characteristics can be suppressed.

In addition, here, the semiconductor region 6c does not reach the other end of the first lateral surface of the trench 9 in the X direction. Therefore, it is possible to prevent a channel from being generated in the lateral surface, on the JFET region 13 side, of the second lateral surface orthogonal to the first lateral surface. In this way, because it is possible to prevent a channel having different characteristics from the channel along the first lateral surface from being generated along the second lateral surface, variations in the MOSFET characteristics can be suppressed. That is, the current is allowed to flow only to the lateral surface (first lateral surface) of the trench 9 in the lateral direction, and the current can be prevented from flowing to other trench lateral surfaces having different plane orientations.

As described above, with the present embodiment, the performance of the silicon carbide semiconductor device can be improved.

<Modification 1>

Figure 8:
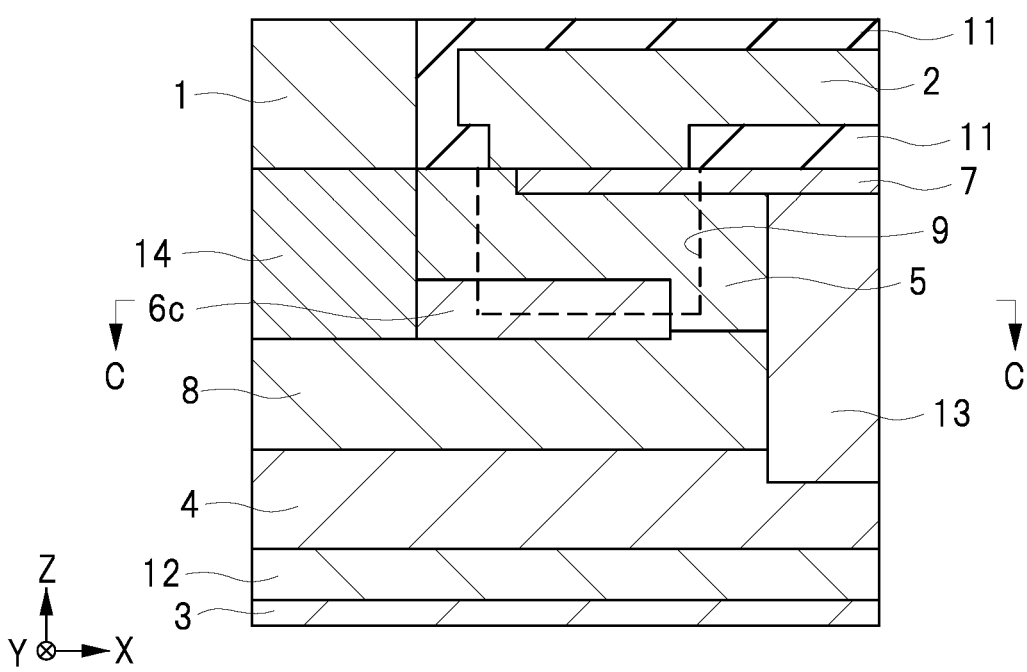
FIG. 8 is a cross-sectional view taken along line A-A in FIG. 7.
Figure 9:
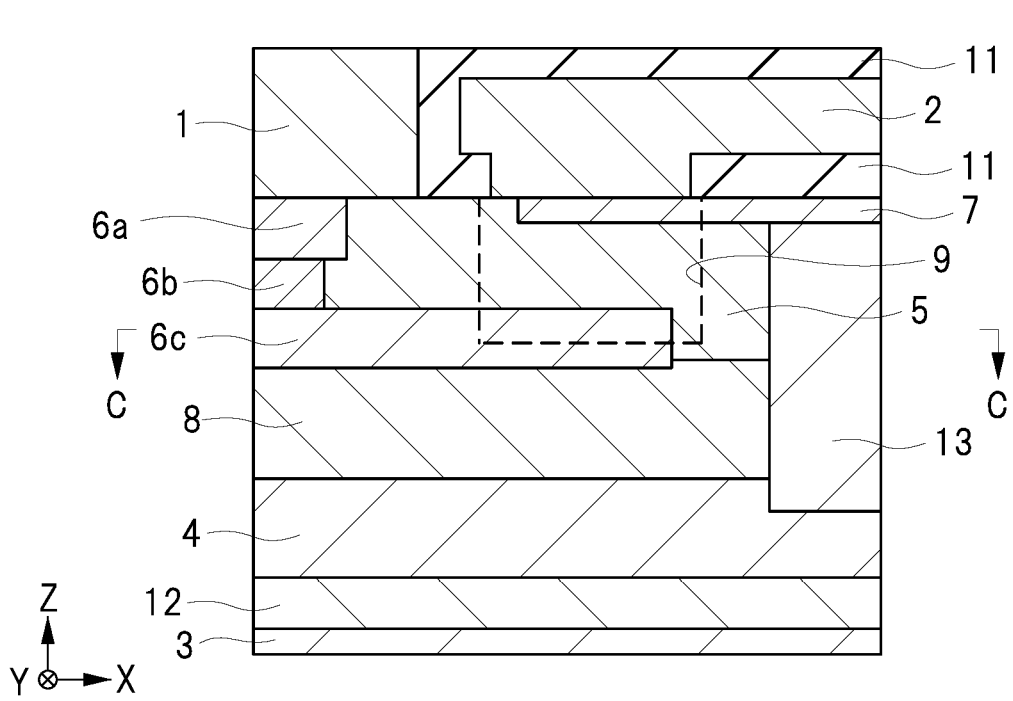
FIG. 9 is a cross-sectional view taken along line D-D in FIG. 7.
Figure 10:
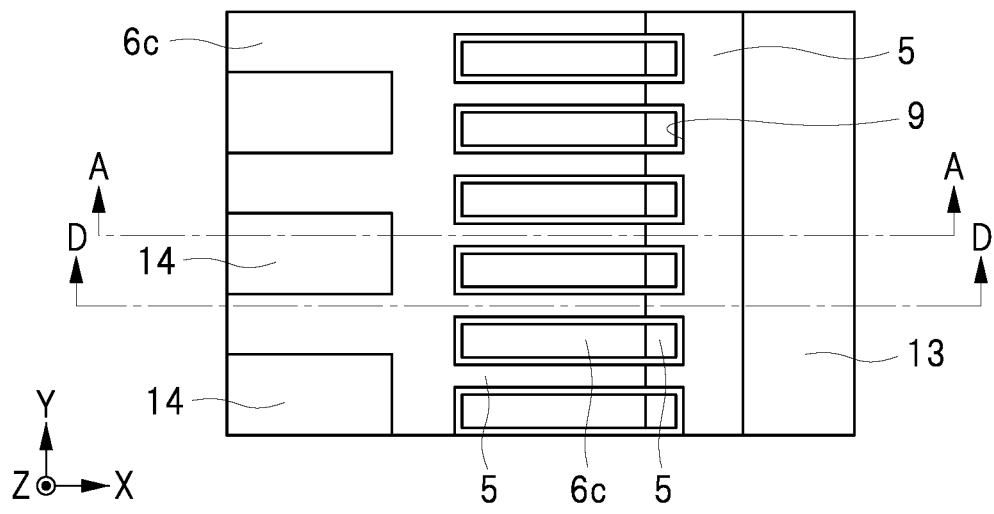
FIG. 10 is a plan view illustrating the silicon carbide semiconductor device split along line C-C in FIG. 8.

As Modification 1 of the present embodiment, a structure in which the source region and the potential fixing region are arranged alternately side by side in the direction of extension of the source contact plug will be described with reference to FIGS. 7 to 10. FIGS. 8 and 9 are cross-sectional views taken along lines A-A and D-D in FIG. 7, respectively. FIG. 10 illustrates a plan view of the semiconductor substrate split along line C-C in FIGS. 8 and 9.

Figure 7:
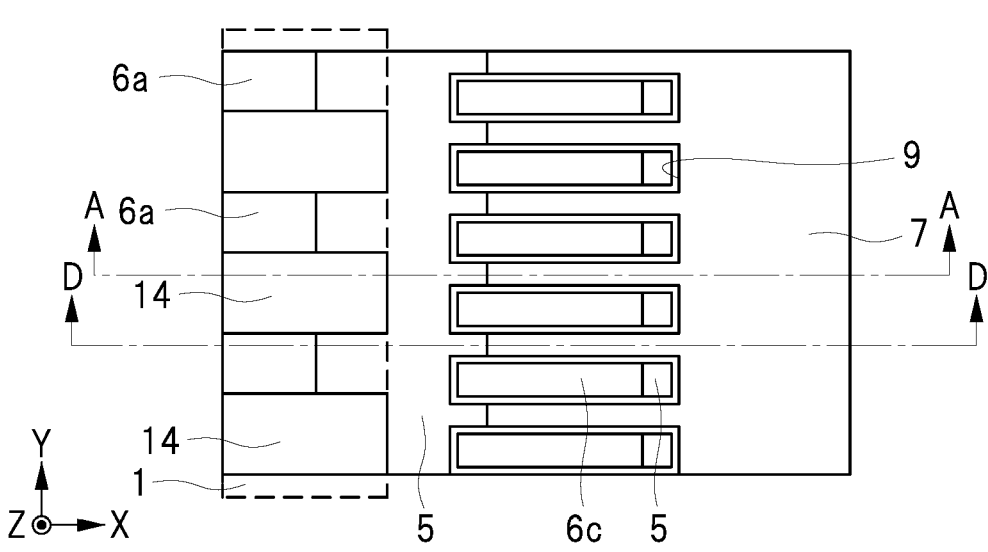
FIG. 7 is a plan view illustrating a silicon carbide semiconductor device which is a Modification 1 according to the embodiment.

As illustrated in FIGS. 7 and 10, the source region 6a and the potential fixing region 14 are arranged alternately side by side in the Y direction. As illustrated in FIG. 8, the potential fixing region 14 is separated from the trench 9 and reaches the upper surface of the guard region 8. That is, the potential fixing region 14 is formed between the guard region 8 and the upper surface of the semiconductor substrate, and is in contact with the body layer 5 and the guard region 8. A source potential is applied to the body layer 5 and the guard region 8 via a potential fixing region 14 electrically connected thereto.

Between the potential fixing regions 14 adjacent to each other in the Y direction, the source region 6a is electrically connected to the semiconductor region 6c via the semiconductor region 6b below the source region 6a. As illustrated in FIG. 10, part of the semiconductor region 6b is located between the trenches 9 arranged side by side in the Y direction, and the other part is located between the potential fixing regions 14 arranged side by side in the Y direction. The source region 6a and the potential fixing region 14 that are formed in the upper surface of the semiconductor substrate are alternately arranged side by side directly below the contact plug (source contact plug) 1 extending in the Y direction, and are connected to the bottom surface of the contact plug 1.

In the present modification, even if the potential fixing region 14 is dispersed downward, the semiconductor region 6c is not divided by the potential fixing region 14. Therefore, the potential fixing region 14 can be formed deeper than the structure illustrated in FIGS. 1 to 6. Accordingly, the potential of the guard region 8 is easily fixed.

<Modification 2>

As Modification 2 of the present embodiment, a structure in which a p⁺-type electric field relaxation layer is formed on a current diffusion region will be described with reference to FIGS. 11 to 14. FIGS. 12 and 13 are cross-sectional views taken along lines A-A and D-D in FIG. 11, respectively. FIG. 14 illustrates a plan view of the semiconductor substrate split along line C-C in FIGS. 12 and 13.

Figure 11:
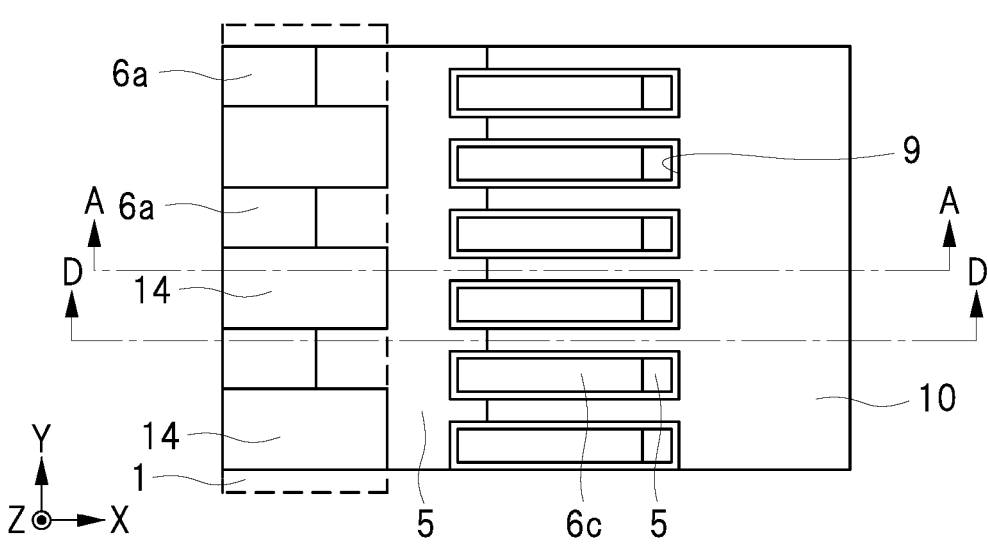
FIG. 11 is a plan view illustrating a silicon carbide semiconductor device which is a Modification 2 according to the embodiment.
Figure 12:
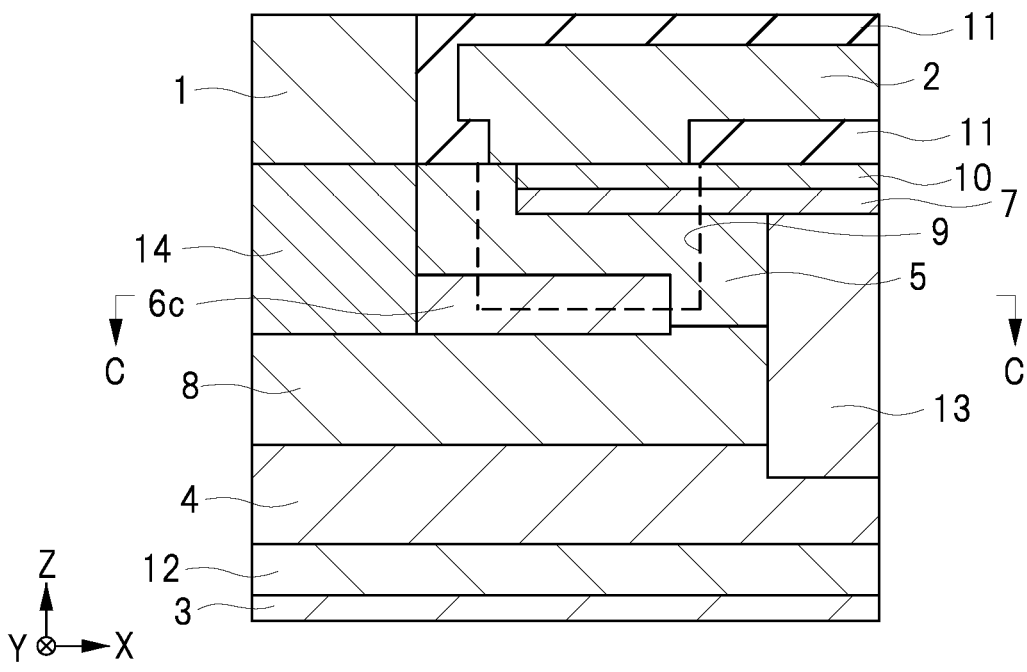
FIG. 12 is a cross-sectional view taken along line A-A in FIG. 11.
Figure 13:
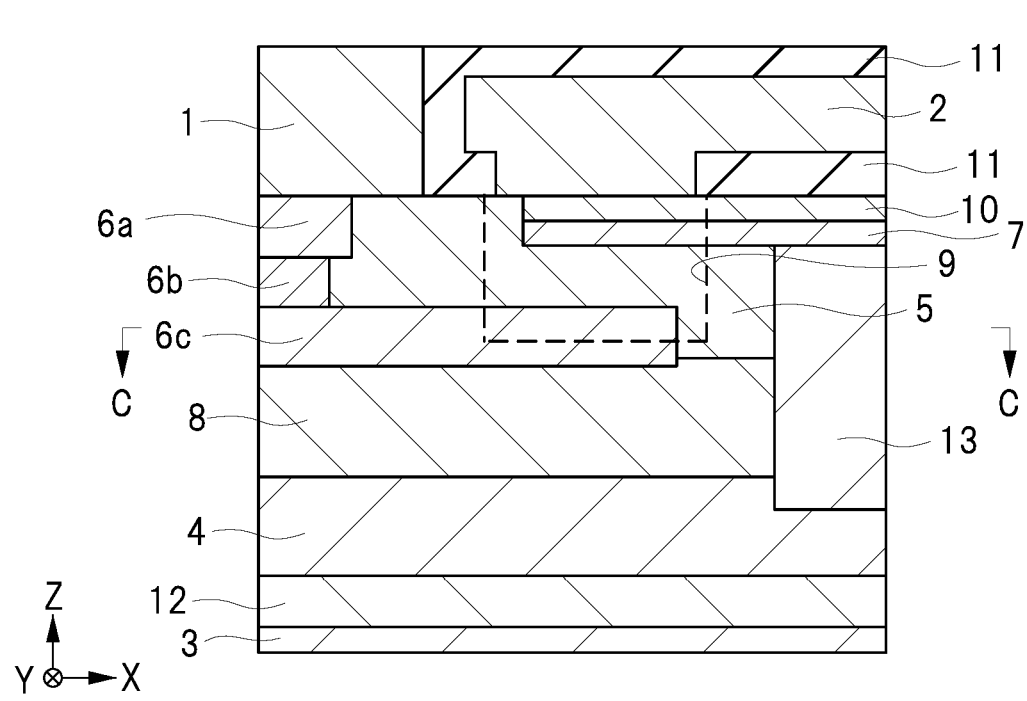
FIG. 13 is a cross-sectional view taken along line D-D in FIG. 11.
Figure 14:
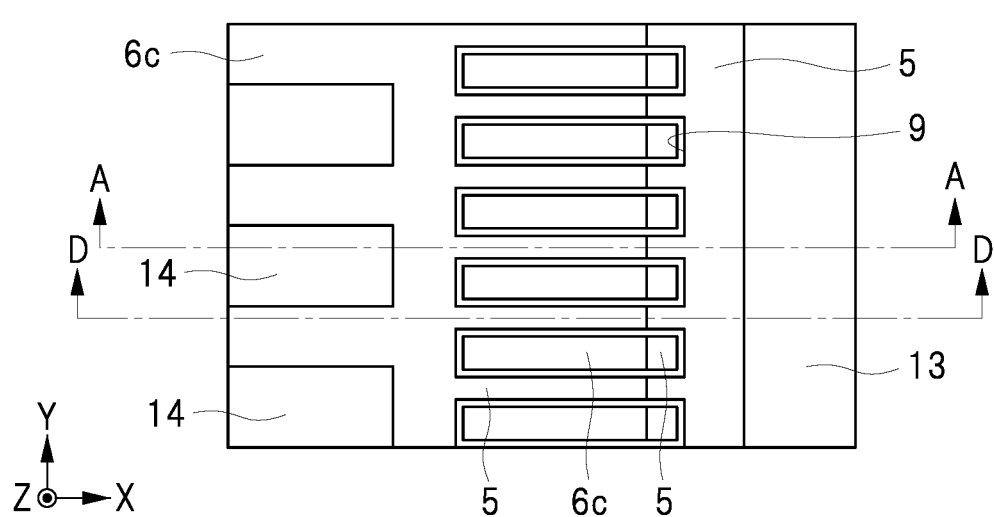
FIG. 14 is a plan view illustrating the silicon carbide semiconductor device split along line C-C in FIG. 12.

As illustrated in FIGS. 11 to 13, the structure of the present modification is different from the structure of Modification 1 described with reference to FIG. 8 in that a p⁺-type electric field relaxation layer 10 is formed on the current diffusion region 7 in the semiconductor substrate. That is, the p⁺-type electric field relaxation layer 10 is formed between the upper surface of the current diffusion region 7 and the upper surface of the semiconductor substrate. The p-type impurity concentration of the p⁺-type electric field relaxation layer 10 is higher than the p-type impurity concentration of the body layer 5. In plan view, the electric field relaxation layer 10 extends in the Y direction similarly to the current diffusion region 7, and part thereof is located between the trenches 9 adjacent in the Y direction. That is, the electric field relaxation layer 10 is in contact with the first lateral surface of the trench 9 on the current diffusion region 7. The electric field relaxation layer 10 is in contact with the potential fixing regions 14 adjacent in the X direction, and a source potential is applied to the electric field relaxation layer 10 via the electrically connected potential fixing region 14.

The current diffusion region 7 on the JFET region 13 is an area where the electric field tends to be strong. Therefore, by providing the electric field relaxation layer 10 as per the present modification, the electric field of the insulating film 11 on the current diffusion region 7 can be weakened. It is thus possible to prevent dielectric breakdown from occurring between the current diffusion region 7 and the gate electrode 2 thereon. In addition, because the source potential is applied to the electric field relaxation layer 10, the gate-drain capacitance between the upper portion of the JFET region 13 and the gate electrode 2 thereon is converted into a gate-source capacitance. As a result, the switching characteristic of the MOSFET is improved.

Furthermore, in comparison with Modification 1, because the current diffusion region 7 is separated from the upper surface toward the lower surface of the semiconductor substrate, it is possible to suppress the occurrence of a parasitic channel on the second lateral surface (lateral surface on the potential fixing region 14 side) of the trench 9. Therefore, variations in the characteristics of the MOSFET can be suppressed.

In addition, here, the effective length of the JFET region is longer than that of Modification 1. That is, based on the fact that the JFET is an n-type semiconductor region sandwiched between p-type semiconductor regions, by forming the potential fixing region 14, the current diffusion region 7 is sandwiched between the potential fixing region 14 and the body layer 5. Therefore, the current diffusion region 7 functions as a JFET region, and the effective length of the JFET region becomes long. The short circuit tolerance is accordingly improved.

<Modification 3>

Figure 15:
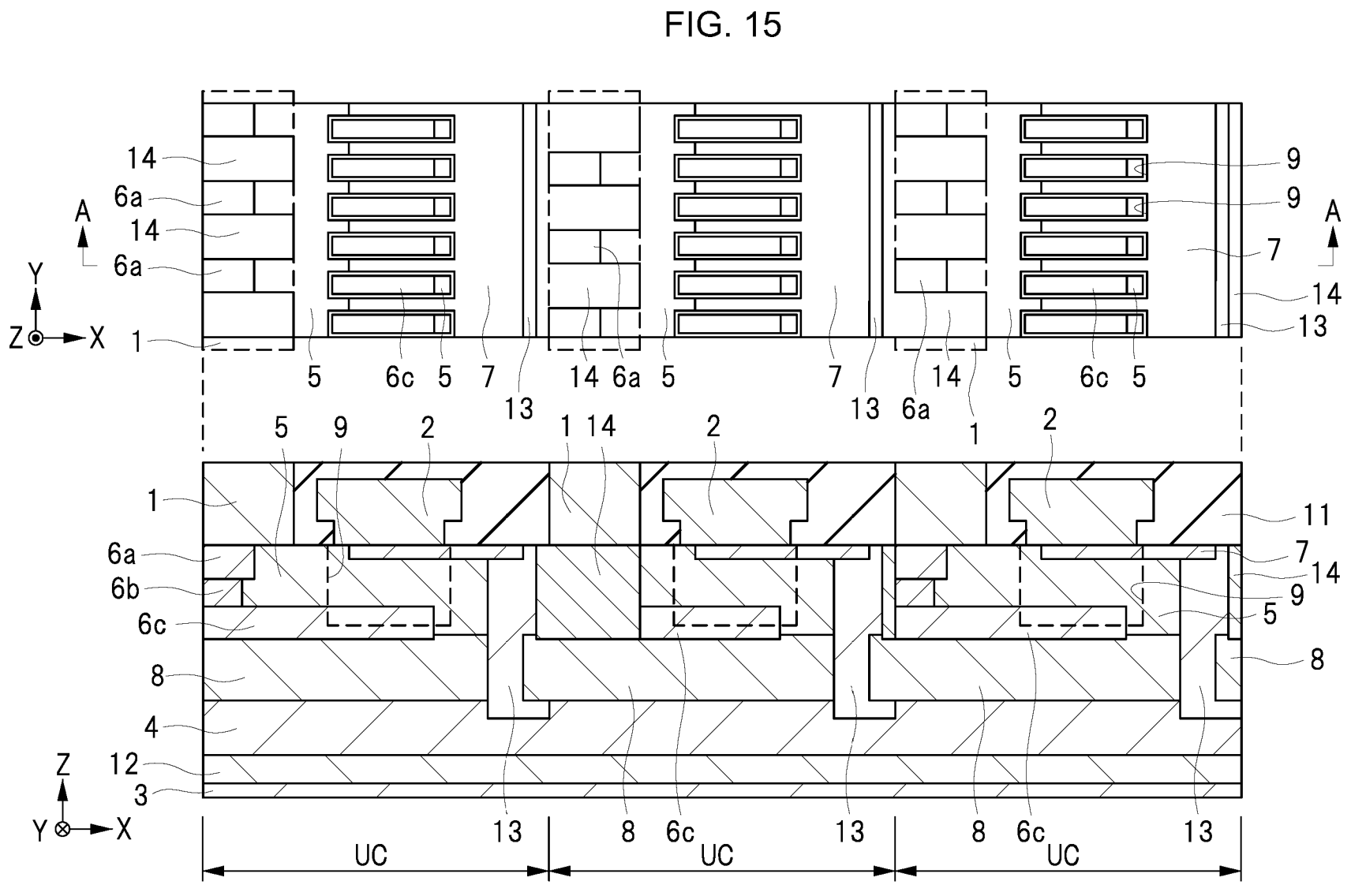

As Modification 3 of the present embodiment, a structure in which adjacent unit cells are arranged side by side without being inverted will be described with reference to FIG. 15. In FIG. 15, a plan view is illustrated on the upper side, and a cross-sectional view of an area corresponding to line A-A of the plan view is illustrated on the lower side.

As illustrated in FIG. 15, in the present modification, unit cells UC adjacent to each other in the X direction are arranged side by side without inverting the structure including the planar layout. Here, part of the JFET region 13 is in contact with the upper surface of the semiconductor substrate, next to the end of the current diffusion region 7. Between the current diffusion region 7 in a predetermined unit cell UC and the source region 6a in another unit cell UC adjacent in the X direction, part of the potential fixing region 14 reaching the upper surface of the guard region 8 from the upper surface of the semiconductor substrate extends in the Y direction. That is, the lateral surface, on the side opposite to that of the trench 9, of the lateral surfaces of the trench 9 in the X direction, is in contact with the potential fixing region 14.

Accordingly, among the unit cells UC adjacent in the X direction, the current diffusion region 7 and the JFET region 13 constituting one unit cell UC, and the source region 6a, the semiconductor regions 6b and 6c that constitute the other unit cell UC are separated by the potential fixing region 14 extending in the Y direction.

In addition, the guard region 8 located on the side opposite to the trench 9 side with respect to the JFET region 13 in the X direction is formed in a convex shape so as to bite into the center side of the JFET region 13 with respect to the lateral surface of the JFET region 13. In other words, in the X direction, the end on the JFET region 13 side of the guard region 8 located on the side opposite to the trench 9 side with respect to the JFET region 13 is terminated on the center side of the JFET region 13 with respect to the lateral surface of the JFET region 13. Accordingly, in the X direction, the width of the JFET region 13 sandwiched between the two guard regions 8 is narrower than the width of the JFET region 13 sandwiched between the body layer 5 and the potential fixing region 14.

In the present modification, because the structures of the adjacent unit cells UC are not inverted from each other, one JFET region 13 is formed for one unit cell. That is, the density of the JFET region 13 can be increased to about 2 times in comparison with the structure described with reference to FIG. 6. Accordingly, the resistance of the JFET region 13 can be reduced.

In addition, because the resistance of the JFET region 13 can be reduced, the distance between the guard regions 8 sandwiching the JFET region 13 in the X direction can be reduced. Accordingly, when the MOSFET is turned off, the depletion layer is readily closed in the JFET region 13 between the adjacent guard regions 8. It is therefore possible to prevent an increase in the resistance of the JFET region 13 and thus suppress the microcurrent and improve the withstand voltage. In addition, because the width of the JFET region 13 is easily adjusted on the path (current path of the JFET region 13) in this manner, the trade-off between the resistance and the threshold voltage of the MOSFET can be improved.

Note that, here, the phases of the arrangements of the potential fixing region 14 and the source region 6a in the unit cells UC adjacent to each other in the X direction are changed, but the arrangements of the potential fixing region 14 and the source region 6a may coincide with each other in adjacent unit cells UC.

<Modification 4>

Figure 16:
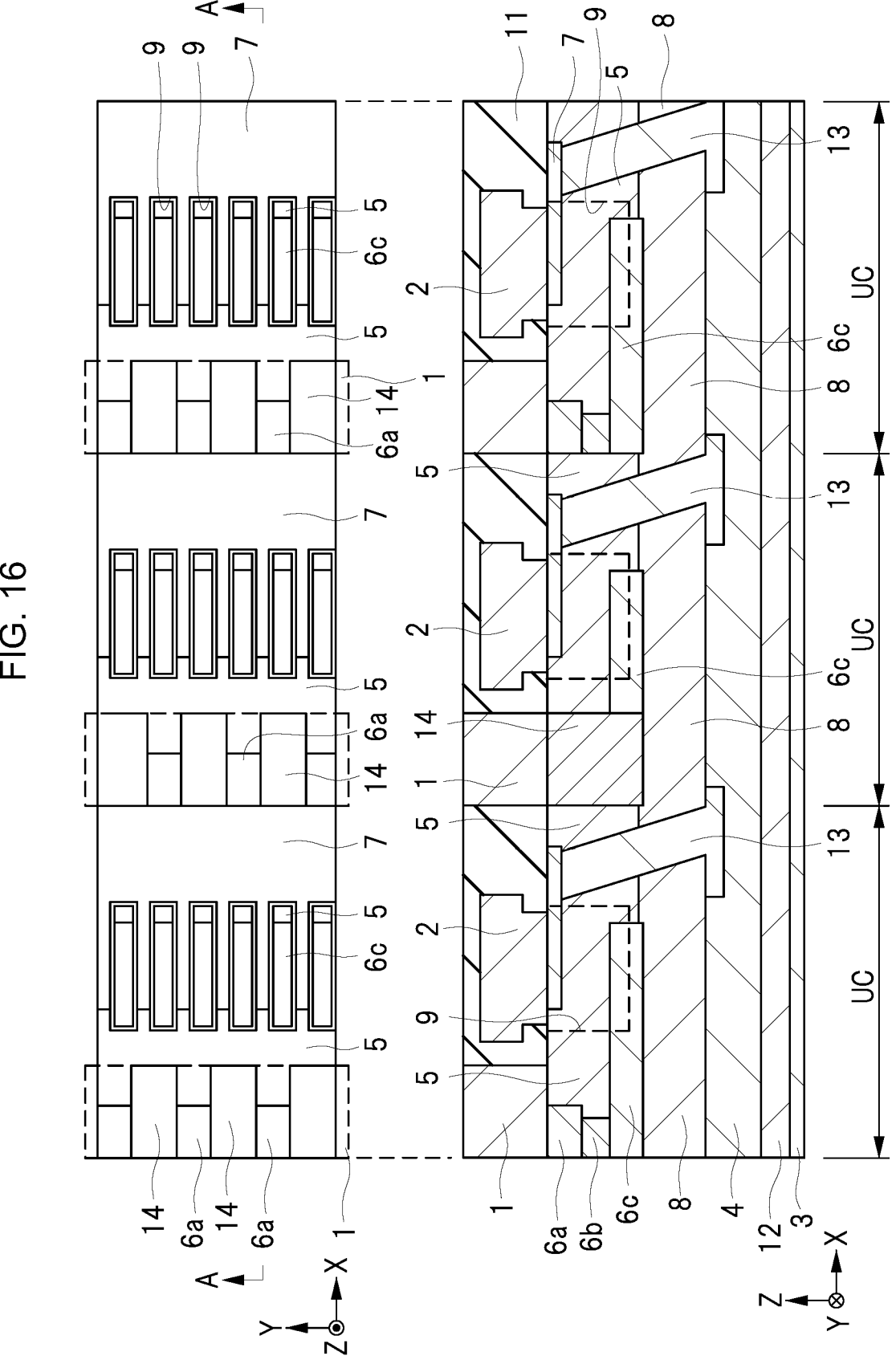
FIG. 16 is a plan view and a cross-sectional view illustrating a plurality of unit cells of the silicon carbide semiconductor device which is a Modification 4 according to the embodiment.

As Modification 4 of the present embodiment, a structure in which adjacent unit cells are arranged side by side without being inverted and a JFET region is obliquely formed will be described with reference to FIG. 16. In FIG. 16, a plan view is illustrated on the upper side, and a cross-sectional view of an area corresponding to line A-A of the plan view is illustrated on the lower side.

As illustrated in FIG. 16, in the present modification, as per Modification 3, the unit cells UC adjacent to each other in the X direction are arranged side by side without inverting the structure including the planar layout. In addition, here, the JFET region 13 is formed at an oblique angle with respect to the upper surface and the lower surface of the semiconductor substrate. Further, here, among the unit cells UC adjacent in the X direction, the current diffusion region 7 and the JFET region 13 constituting one unit cell UC, and the source region 6a and the semiconductor regions 6b and 6c that constitute the other unit cell UC are separated by the body layer 5. The width of the obliquely formed JFET region 13 in the X direction is substantially constant at any height.

The JFET region 13 of the present modification is formed by an oblique ion implantation method, for example. The JFET region 13 has an angle at which the distance from the trench 9 in the X direction gradually increases from the upper surface toward the lower surface of the semiconductor substrate. Therefore, the arrangement cycle (cell pitch) of the unit cells UC can be reduced for the following reasons. That is, here, the JFET region 13 in a portion close to the lower surface of the high-voltage semiconductor substrate is separated from the trench 9. Although the electric field tends to concentrate at the lower corner of the trench 9, the lower corner of the trench 9, and the JFET region 13 can be separated by forming the JFET region 13 obliquely. Accordingly, a withstand voltage can be secured between the trench 9 and the JFET region 13. Therefore, the distance between the trench 9 and the upper end of the JFET region 13 can be shortened. As a result, the current diffusion region 7 in the unit cell UC and the contact plug 1 in the adjacent unit cell UC can be separated via the body layer 5. Accordingly, the distance between the contact plug 1 and the JFET region 13 in plan view can be reduced. As described above, the arrangement cycle (cell pitch) of the unit cells UC can be reduced. In order to avoid a short circuit between the trench 9 and the JFET region 13, the upper end of the JFET region 13 is separated from the trench 9.

In addition, here, because the JFET region 13 is formed obliquely, the length (current path) of the JFET region 13 can be extended in comparison with the case where the JFET region 13 is formed perpendicular to the upper surface of the semiconductor substrate. The MOSFET short circuit tolerance is thus improved.

<Modification 5>

Figure 17:
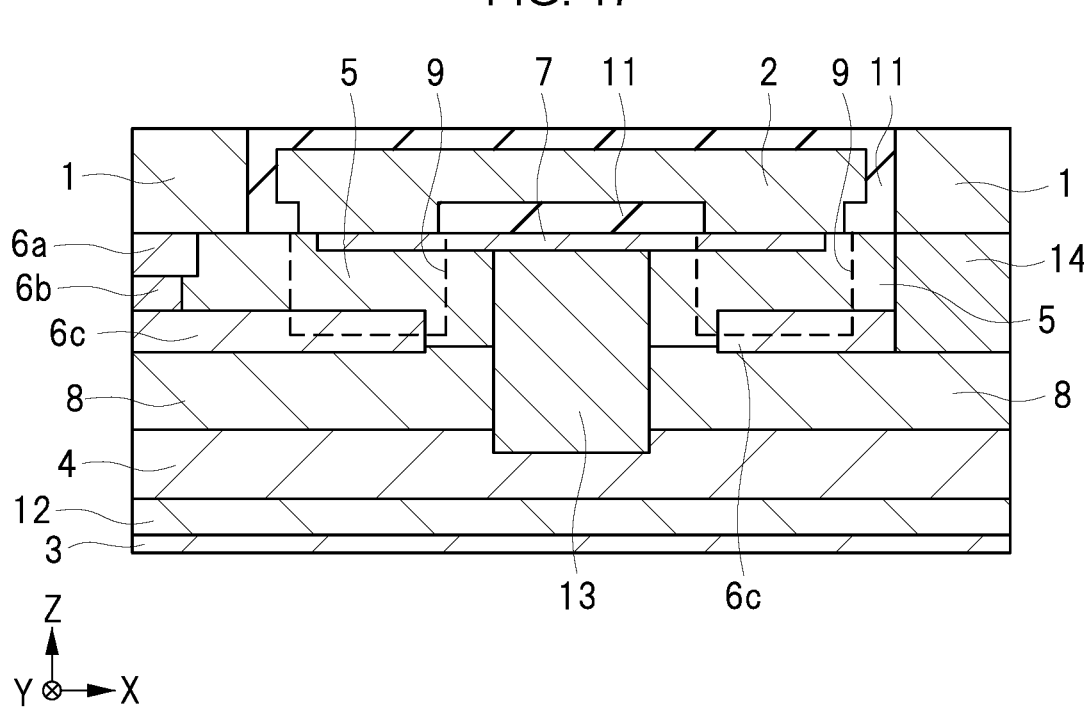
FIG. 17 is a cross-sectional view illustrating a plurality of unit cells of the silicon carbide semiconductor device which is a Modification 5 according to the embodiment.
Figure 18:
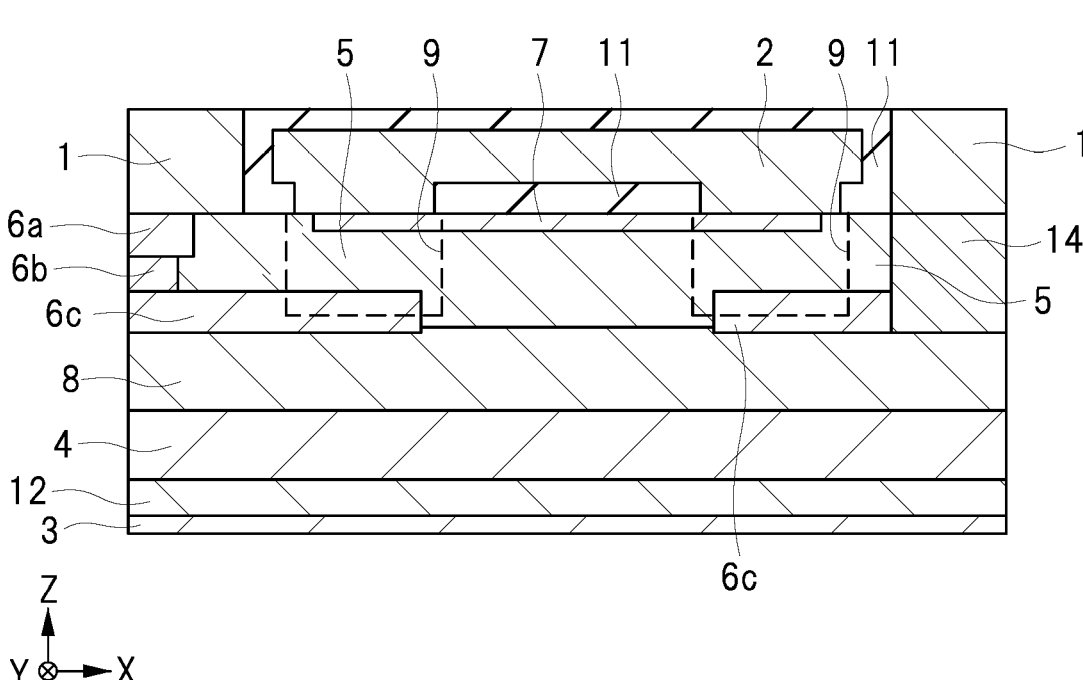
FIG. 18 is a cross-sectional view illustrating a plurality of unit cells of the silicon carbide semiconductor device which is a Modification 3 according to the embodiment.
Figure 19:
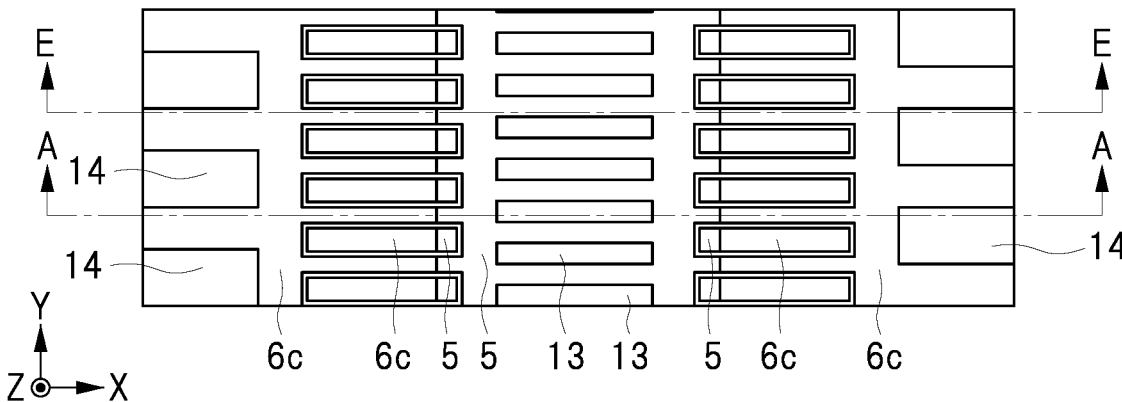
FIG. 19 is a plan view illustrating a plurality of unit cells of the silicon carbide semiconductor device which is a Modification 3 according to the embodiment.

As Modification 5 of the present embodiment, a structure in which a plurality of JFET regions are arranged side by side in the Y direction will be described with reference to FIGS. 17 to 19. FIGS. 17 and 18 are cross-sectional views illustrating a silicon carbide semiconductor device of the present modification. FIG. 19 is a plan view illustrating a silicon carbide semiconductor device according to the present modification. FIG. 17 is a cross-sectional view taken along line A-A in FIG. 19, and FIG. 18 is a cross-sectional view taken along line E-E in FIG. 19. In FIGS. 17 to 19, two unit cells are illustrated side by side.

As illustrated in FIGS. 17 to 19, in the present modification, a plurality of JFET regions 13 extending in the X direction are arranged side by side in the Y direction in each unit cell. That is, the JFET region 13 of the present modification is a FIN-type JFET region. Here, the adjacent unit cells UC have mutually inverted structures at the boundaries thereof. The phases of the arrangement of the potential fixing region 14 and the source region 6a in the unit cells UC adjacent to each other in the X direction are not the same, but may be the same. The body layer 5 is formed between the JFET regions 13 adjacent to each other in the Y direction. Other structures are similar to those described with reference to FIG. 5.

The narrower the width of the JFET region, the better the short circuit tolerance, but it is necessary to compensate for the increased on-resistance by increasing the number of JFET regions. As per the present modification, by forming a plurality of FIN-type JFET regions having a small width in the Y direction, the number of effective JFET regions 13 can be increased.

Here, the width of the JFET region is 1 μm, and the cell pitch excluding the formation portion of the JFET region is 6 μm. In the structure in which the JFET region extends in the Y direction, the density of the JFET region is (length of the JFET region per unit cell)/(unit cell surface area)=1 $\mu m/(1+6) \mu m=0.14 \mu m/\mu m^2$.

In the present modification, assuming that the length of the formation portion of the JFET region 13 is L and the arrangement cycle of the JFET region is P, for example, when L=5 μm and P=2 μm, L/P(L+6)=5 $\mu m/2 \mu m \times 11 \mu m=0.23 \mu m/\mu m^2$, and the density of the JFET region can be approximately 1.5 times. Accordingly, the resistance of the JFET region 13 can be reduced.

<Modification 6>

Figure 20:
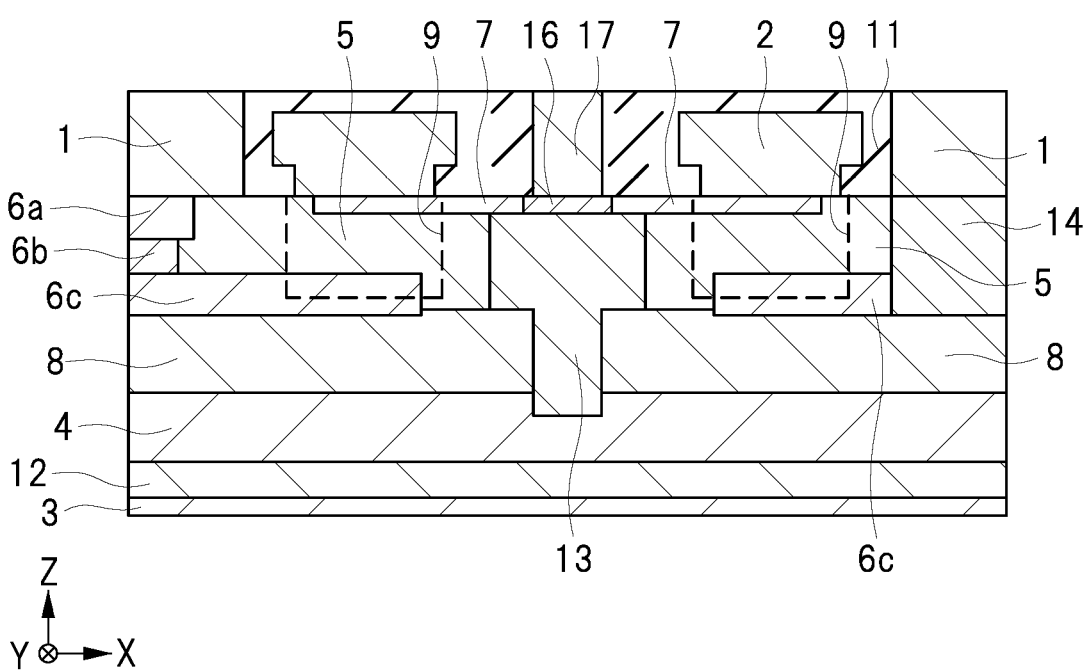
FIG. 20 is a cross-sectional view illustrating a plurality of unit cells of the silicon carbide semiconductor device which is a Modification 6 according to the embodiment.

As Modification 6 of the present embodiment, a structure in which a Schottky barrier diode is formed directly above a JFET region will be described with reference to FIG. 20. FIG. 20 is a cross-sectional view illustrating a silicon carbide semiconductor device in the present modification, showing two adjacent unit cells.

As illustrated in FIG. 20, here, adjacent unit cells UC have mutually inverted structures at the boundaries thereof. In the present modification, a plurality of JFET regions 13 extending in the X direction are arranged side by side in the Y direction in each unit cell. The phases of the arrangement of the potential fixing region 14 and the source region 6a in the unit cells UC adjacent to each other in the X direction are not the same, but may be the same.

Here, the JFET region 13 has a first portion adjacent to the body layer 5 in the X direction and having a relatively large width in the X direction, and a second portion adjacent to the guard region 8 in the X direction and having a smaller width in the X direction than the first portion. An n-type semiconductor region 16 in contact with the upper surface of the semiconductor substrate is formed in the semiconductor substrate directly above the first portion and sandwiched between the two current diffusion regions 7 in the X direction. That is, the semiconductor region 16 is formed between the upper surface of the semiconductor substrate and the upper surface of the JFET region 13, and is connected to the upper surface of the JFET region 13. The n-type impurity concentration of the semiconductor region 16 is lower than the n-type impurity concentration of the JFET region 13.

In the insulating film 11 on the upper surface of the semiconductor substrate, a through-hole (connecting hole) penetrating the insulating film 11 directly above each of the JFET region 13 and the semiconductor region 16 is formed, and a contact plug 17 is embedded in the through-hole. The bottom surface of the contact plug 17 is connected to the semiconductor region 16. The connecting portion between the contact plug 17 and the semiconductor region 16 forms a Schottky junction to constitute a Schottky barrier diode. Other structures are similar to those described with reference to FIG. 5.

In the present modification, by providing a Schottky barrier diode, it is possible to suppress the energy degradation that is peculiar to SiC power devices. That is, the junction between the p-type semiconductor region including the potential fixing region 14 and the guard region 8 and the n-type semiconductor region including the drain region 12 and the drift layer 4 constitutes a PN diode. The PN diode is a bipolar element through which holes and electrons flow. In an SiC power device, when holes flow in the PN diode, there is the problem of characteristic degradation.

In the present modification, because holes flow through the Schottky barrier diode, only electrons mainly flow through the PN diode. Therefore, the flow of holes through the PN diode can be suppressed, and energy degradation can be curbed. Further, diode loss and switching loss can be reduced.

Although the invention made by the present inventors has been described in specific terms based on the embodiments, the present invention is not limited to or by the foregoing embodiments, and it is understood that various modifications can be implemented without departing from the spirit of the present invention.

For example, the material, conductivity type, manufacturing conditions, and so forth of each part are not limited to the disclosures of the foregoing embodiments, and it goes without saying that each part can be modified in multiple ways. Here, for the sake of an expedient description, the conductivity types of the semiconductor substrate and the semiconductor film have been fixed, but the present invention is not limited to the conductivity types described in the foregoing embodiments. That is, although an n-type SiC power MISFET has been described in the first embodiment and each modification, the same advantageous effects as those of the foregoing embodiments and each modification can also be obtained in a p-type SiC power MISFET in which the conductivity types of the semiconductor regions are inverted.

Further, the first embodiment and Modifications 2 to 5 can be combined with each other as long as there is no contradiction such as a difference in orientation of the unit cells.

The invention claimed is:

1. A silicon carbide semiconductor device, comprising:
a silicon carbide semiconductor substrate having a first main surface and a second main surface on a side opposite to that of the first main surface;
a source electrode formed on the first main surface;
a plurality of side-by-side source contact regions that are connecting portions between the first main surface and the source electrode and that extend along the first main surface;
a plurality of trenches formed side by side in a direction parallel to a long side of the source contact regions, in the first main surface between the source contact regions, which are adjacent to each other in a short-side direction of the source contact regions;
a gate electrode formed in the trenches via an insulating film;
a first semiconductor region of a first conductivity type; a second semiconductor region of a second conductivity type different from the first conductivity type; a third semiconductor region of the first conductivity type that is in contact with a first lateral surface of the trench and to which a source potential is applied; a fourth semiconductor region of the second conductivity type that is in contact with the first lateral surface of the trench and that has an impurity concentration lower than that of the second semiconductor region; a fifth semiconductor region of the first conductivity type that is in contact with the first lateral surface of the trench, the first semiconductor region, the second semiconductor region, the third semiconductor region, the fourth semiconductor region, and the fifth semiconductor region being formed in order from the second main surface toward the first main surface in the silicon carbide semiconductor substrate; and
a sixth semiconductor region of the first conductivity type that is formed in the silicon carbide semiconductor substrate so as to be separated from the trench and that connects the fifth semiconductor region and the first semiconductor region,
wherein the third semiconductor region is separated from the first semiconductor region, the fifth semiconductor region, and the sixth semiconductor region,
wherein the gate electrode, and the third semiconductor region, the fourth semiconductor region, and the fifth semiconductor region, which are regions adjacent to the first lateral surface of the trench and overlapping each other in plan view, constitute a field effect transistor, and
wherein a channel of the field effect transistor is generated between the third semiconductor region and the fifth semiconductor region in the fourth semiconductor region in contact with the first lateral surface of the trench.

2. The silicon carbide semiconductor device according to claim 1, further comprising:
a seventh semiconductor region of the first conductivity type; and an eighth semiconductor region of the first conductivity type that are formed in that order on the first main surface side with respect to the third semiconductor region,
wherein the source contact regions are connected to the eighth semiconductor region in the first main surface,
wherein an impurity concentration of the seventh semiconductor region is lower than an impurity concentration of either of the third semiconductor region and the eighth semiconductor region,
wherein the seventh semiconductor region and the eighth semiconductor region are separated from the trench, and
wherein a source potential is applied to the third semiconductor region via the source contact region, the eighth semiconductor region, and the seventh semiconductor region.

3. The silicon carbide semiconductor device according to claim 1,
wherein the fifth semiconductor region is separated from one end of the trench in a first direction along the first main surface, and the first lateral surface of the trench.

4. The silicon carbide semiconductor device according to claim 1,
wherein the third semiconductor region is separated from one end of the trench in a first direction along the first main surface, and the first lateral surface of the trench.

5. The silicon carbide semiconductor device according to claim 2, further comprising:
a ninth semiconductor region of the second conductivity type that is formed between the first main surface and the third semiconductor region so as to be separated from the fifth semiconductor region, and that has a higher impurity concentration than that of the fourth semiconductor region,
wherein the ninth semiconductor region is in contact with the fourth semiconductor region and is electrically connected to the source contact region and the second semiconductor region.

6. The silicon carbide semiconductor device according to claim 2, further comprising:
a ninth semiconductor region of the second conductivity type that is formed between the first main surface and the second semiconductor region so as to be separated from the fifth semiconductor region and the trench, and that has a higher impurity concentration than that of the fourth semiconductor region, wherein the ninth semiconductor region is in contact with the fourth semiconductor region and the second semiconductor region and is connected to the source contact regions.

7. The silicon carbide semiconductor device according to claim 2, wherein the first semiconductor region, the second semiconductor region, the third semiconductor region, the fourth semiconductor region, the fifth semiconductor region, the sixth semiconductor region, the seventh semiconductor region, and the eighth semiconductor region constitute a unit cell, wherein a plurality of the unit cells are arranged side by side in a first direction along the first main surface, and the first lateral surface of the trench, wherein the seventh semiconductor region and the eighth semiconductor region are located on a side opposite to that of the sixth semiconductor region so as to sandwich the trench, in the first direction, and wherein the unit cells adjacent to each other in the first direction have a structure that is line-symmetric about a boundary line between the unit cells in plan view.

8. The silicon carbide semiconductor device according to claim 2, wherein the first semiconductor region, the second semiconductor region, the third semiconductor region, the fourth semiconductor region, the fifth semiconductor region, the sixth semiconductor region, the seventh semiconductor region, and the eighth semiconductor region constitute a unit cell, wherein a plurality of the unit cells are arranged side by side without planar layout inversion, in a first direction along the first main surface, and the first lateral surface of the trench, wherein the seventh semiconductor region and the eighth semiconductor region are located on a side opposite to that of the sixth semiconductor region so as to sandwich the trench, in the first direction, and wherein, among the unit cells adjacent to each other in the first direction, the fifth semiconductor region and the sixth semiconductor region that constitute one of the unit cells, and the third semiconductor region constituting the other unit cell are separated from each other by a tenth semiconductor region of the second conductivity type formed in the silicon carbide semiconductor substrate.

9. The silicon carbide semiconductor device according to claim 1, further comprising:

an eleventh semiconductor region of the second conductivity type formed in the silicon carbide semiconductor substrate between the fifth semiconductor region and the first main surface.

10. The silicon carbide semiconductor device according to claim 8, wherein the sixth semiconductor region has an angle at which a distance from the trench in the first direction gradually increases from the first main surface toward the second main surface.

11. The silicon carbide semiconductor device according to claim 1, wherein the first semiconductor region, the second semiconductor region, the third semiconductor region, the fourth semiconductor region, the fifth semiconductor region, and the sixth semiconductor region constitute a unit cell, wherein a plurality of the unit cell are arranged side by side in a first direction along the first main surface and the first lateral surface of the trench, wherein, in the unit cell, a plurality of the sixth semiconductor region are arranged side by side in a second direction orthogonal to the first direction in plan view, and wherein at least one of the fourth semiconductor region and the second semiconductor region is formed between the sixth semiconductor regions adjacent to each other in the second direction.

12. The silicon carbide semiconductor device according to claim 1, further comprising:

a twelfth semiconductor region of the first conductivity type formed between the sixth semiconductor region and the first main surface in the silicon carbide semiconductor substrate and connected to the sixth semiconductor region, the twelfth semiconductor region having a lower impurity concentration than that of the fifth semiconductor region; and a connecting portion formed on the first main surface and joined to the twelfth semiconductor region by a Schottky junction, wherein the twelfth semiconductor region and the connecting portion joined by the Schottky junction constitute a Schottky barrier diode.

13. The silicon carbide semiconductor device according to claim 1, wherein the second semiconductor region is separated from the trench.

* * * * *